US009685945B2

(12) United States Patent
Osanai

(10) Patent No.: US 9,685,945 B2
(45) Date of Patent: Jun. 20, 2017

(54) ELECTRIC CIRCUIT

(71) Applicant: Toyota Jidosha Kabushiki Kaisha, Toyota-shi, Aichi-ken (JP)

(72) Inventor: Yosuke Osanai, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 15/219,173

(22) Filed: Jul. 25, 2016

(65) Prior Publication Data
US 2017/0033790 A1 Feb. 2, 2017

(30) Foreign Application Priority Data

Jul. 28, 2015 (JP) .................. 2015-148387

(51) Int. Cl.
H03K 3/00 (2006.01)
H03K 17/567 (2006.01)
H03K 17/0812 (2006.01)

(52) U.S. Cl.
CPC ..... *H03K 17/567* (2013.01); *H03K 17/08128* (2013.01)

(58) Field of Classification Search
CPC ................ H03K 17/567; H03K 17/08128
USPC ....................................... 327/108
See application file for complete search history.

(56) References Cited

U.S. PATENT DOCUMENTS

| | | | | |
|---|---|---|---|---|
| 4,207,478 A * | 6/1980 | Marumoto | ............. | H03K 17/12 323/289 |
| 5,949,273 A * | 9/1999 | Mourick | .......... | H03K 17/08128 327/324 |
| 6,271,708 B1 * | 8/2001 | Hoshi | .................. | H03K 17/164 327/377 |
| 6,515,531 B2 * | 2/2003 | Ruff | ................ | H03K 17/08128 327/309 |
| 6,518,821 B2 * | 2/2003 | Joerg | .................... | H03K 17/127 327/112 |
| 7,583,109 B2 * | 9/2009 | Oughton, Jr. | ........... | H02M 1/08 327/108 |
| 8,138,818 B2 * | 3/2012 | Tsunoda | ............. | H03K 17/0406 327/108 |
| 8,471,622 B2 * | 6/2013 | Ishikawa | .......... | H03K 17/08128 327/108 |
| 2012/0013370 A1 | 1/2012 | Mori | | |

(Continued)

FOREIGN PATENT DOCUMENTS

| | | |
|---|---|---|
| JP | 2008-235547 A | 10/2008 |
| JP | 2009-225531 A | 10/2009 |

(Continued)

*Primary Examiner* — Kenneth B Wells
(74) *Attorney, Agent, or Firm* — Dinsmore & Shohl LLP

(57) ABSTRACT

An electric circuit includes: a plurality of switching elements connected in parallel to each other, the plurality of switching elements including a first switching element and a second switching element; a control voltage application element applying a control voltage to a connection point at which respective gates of the plurality of switching elements are connected to each other; a connection point grounding element grounding the connection point; and a control circuit configured to put the first switching element into an ON state and maintain the second switching element in an OFF state during a stand-by period, and put the second switching element into an ON state after an elapse of the stand-by period.

16 Claims, 25 Drawing Sheets

(56) References Cited

U.S. PATENT DOCUMENTS

2014/0203848 A1 7/2014 Miyachi et al.
2014/0218099 A1 8/2014 Yamada et al.

FOREIGN PATENT DOCUMENTS

| JP | 2010-213371 A | 9/2010 |
| JP | 2012-023899 A | 2/2012 |
| JP | 2014-143788 A | 8/2014 |
| JP | 2014-150696 A | 8/2014 |

* cited by examiner

ELECTRIC CIRCUIT

CROSS-REFERENCE TO RELATED APPLICATIONS

This application claims priority to Japanese Patent Application No. 2015-148387 filed on Jul. 28, 2015 the entire content of which are incorporated by reference.

BACKGROUND

1. Field

The disclosure relates to an electric circuit that includes a plurality of switching elements which are connected in parallel to each other.

2. Description of Related Art

According to the related art, a resonance is generated between a plurality of IGBTs, by a capacitance generated between a gate and an emitter of the IGBT and a wiring inductance, in an electric circuit where the plurality of IGBTs are connected in parallel to each other. According to a technique, resistors for resonance suppression are disposed at the gates of the plurality of IGBTs such that the resonance is prevented (Japanese Patent Application Publication No. 2014-150696 (JP 2014-150696 A)).

According to another technique regarding an electric circuit that drives a plurality of switching elements connected in parallel to each other in synchronization with each other, ON-OFF switching timings of the respective switching elements are relatively adjusted based on a threshold voltage difference (Japanese Patent Application Publication No. 2009-225531 (JP 2009-225531 A)).

SUMMARY

In the case of a difference between inductances of emitter wiring and source wiring of the switching elements connected in parallel to each other, an oscillation might be caused in the electric circuit even if the resistor for resonance suppression is disposed or the ON-OFF switching timing is adjusted based on the threshold voltage difference of the switching elements themselves.

An electric circuit according to a first aspect of the disclosure includes: a plurality of switching elements connected in parallel to each other, the plurality of switching elements including a first switching element and a second switching element; a control voltage application element applying a control voltage to a connection point at which respective gates of the plurality of switching elements are connected to each other; a connection point grounding element grounding the connection point; and a control circuit configured to put the first switching element into an ON state and maintain the second switching element in an OFF state during a stand-by period, and put the second switching element into an ON state after an elapse of the stand-by period.

An electric circuit according to a second aspect of the disclosure includes: a plurality of switching elements connected in parallel to each other, the plurality of switching elements including a first switching element and a second switching element; a control voltage application element applying a control voltage to a connection point at which respective gates of the plurality of switching elements are connected to each other; a connection point grounding element grounding the connection point; and a control circuit configured to put the second switching element into an OFF state and maintain the first switching element in an ON state during a stand-by period, and put the first switching element into an OFF state after the stand-by period.

According to the above-described aspects, an oscillation that is attributable to a wiring inductance difference can be suppressed in an electric circuit including a plurality of switching elements which are connected in parallel to each other.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 20:
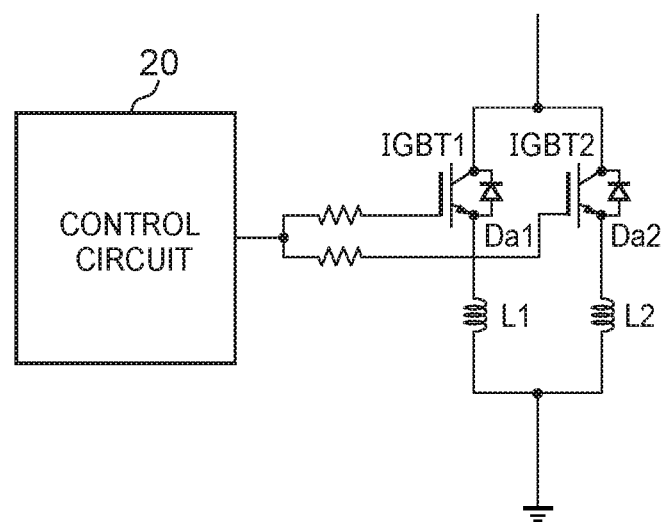
FIG. 20 is a diagram illustrating a configuration of an electric circuit according to the related art.
Figure 21:
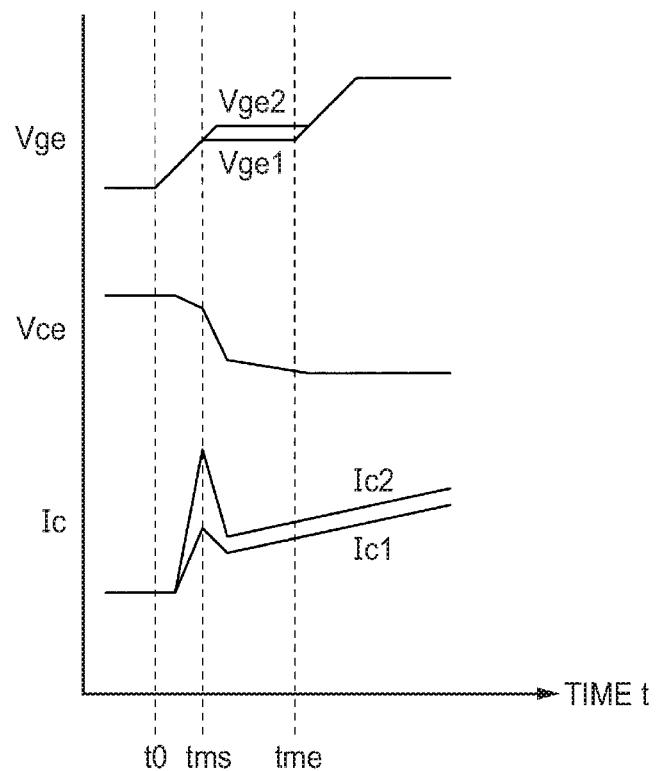
FIG. 21 is a diagram illustrating a timing chart at a time of an ON control of the electric circuit according to the related art.
Figure 22:
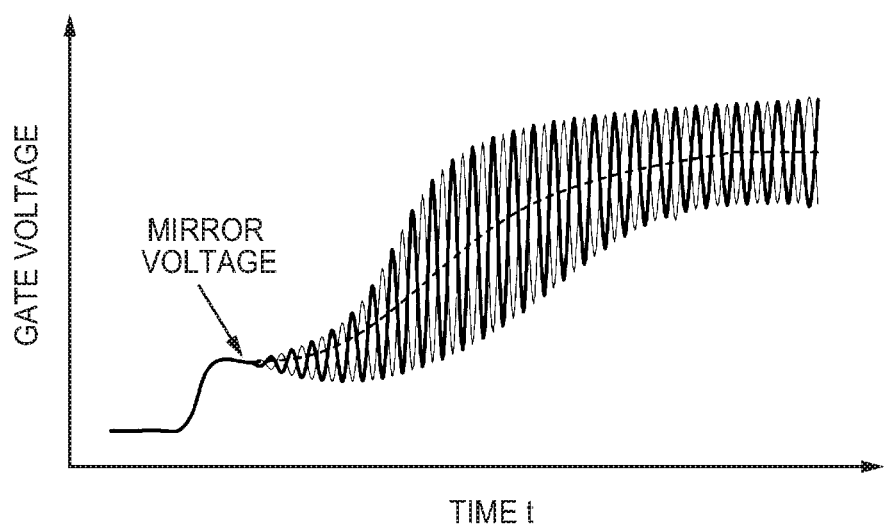
FIG. 22 is a diagram showing an oscillation at the time of the ON control of the electric circuit according to the related art.

In a circuit configuration according to the related art that is illustrated in FIG. 20, gate voltages Vge1, Vge2 of an IGBT1 and an IGBT2 rise as illustrated in FIG. 21 and collector currents Ic1, Ic2 temporally increase therewith as well once a voltage is applied from a control circuit 20 to gate terminals of the IGBT1 and the IGBT2 at time t0. Inductances L1, L2 are present on respective emitter sides of the IGBT1 and the IGBT2, and voltages VL1, VL2 are generated as a result of these inductances L1, L2, respectively. Accordingly, emitter voltages of the IGBT1 and the IGBT2 temporally rise as well. In a case where the inductance L1 is larger than the inductance L2, the current Ic1 that flows through the inductance L1 falls short of the current Ic2 that flows through the inductance L2 and the gate voltage Vge1 of the IGBT1 falls short of the gate voltage Vge2 of the IGBT2. The rise in the gate voltages Vge1, Vge2 is followed by a period (mirror period) from time tms to time tme, in which the gate voltages Vge1, Vge2 are temporally and substantially constant. The voltage at this time will be referred to as a mirror voltage. After the mirror period, a diode recovery current of an opposite arm is generated and the currents Ic1, Ic2 rise temporarily. Then, the recovery current disappears. As a result, the currents Ic1, Ic2 that flow through the inductances L1, L2 are reduced, the emitter voltages of the IGBT1 and the IGBT2 are reduced, and the gate voltages Vge1, Vge2 of the IGBT1 and the IGBT2 rise. At this time, the gate voltage Vge2 is higher than the gate voltage Vge1, and thus the current Ic2 of the IGBT2 exceeds the current Ic1 of the IGBT1 and the current Ic1 of the IGBT1 is reduced. Once the current Ic2 of the IGBT2 increases, the emitter voltage of the IGBT2 rises and the gate voltage Vge2 decreases. Once the current Ic1 of the IGBT1 decreases, the emitter voltage of the IGBT1 falls and the gate voltage Vge1 rises. Once the gate voltage Vge1 becomes higher than the gate voltage Vge2 with time, the current Ic1 of the IGBT1 exceeds the current Ic2 of the IGBT2 and the current Ic2 of the IGBT2 decreases. Once the current Ic1 of the IGBT1 increases thereafter, the emitter voltage of the IGBT1 rises and the gate voltage Vge1 falls. Once the current Ic2 of the IGBT2 falls, the emitter voltage of the IGBT2 is reduced and the gate voltage Vge2 rises. In this manner, the gate voltage Vge1 of the IGBT1 and the gate voltage Vge2 of the IGBT2 temporally change places in their magnitude relationship, resulting in an oscillation in the circuit. FIG. 22 shows a time-dependent change in the gate voltage at a time when the IGBT1 and the IGBT2 are turned ON. Ideally, the gate voltage does not oscillate, as illustrated by the dashed line in FIG. 22, when the IGBT1 and the IGBT2 are turned ON. When the inductances L1, L2 of emitter wiring (source wiring) of the IGBT1 and the IGBT2 have a deviation, however, the oscillation is likely to be caused with a balance of the currents flowing through the IGBT1 and the IGBT2 collapsed, as illustrated by the solid line in FIG. 22, when the gate voltage is close to the mirror voltage.

Figure 23:
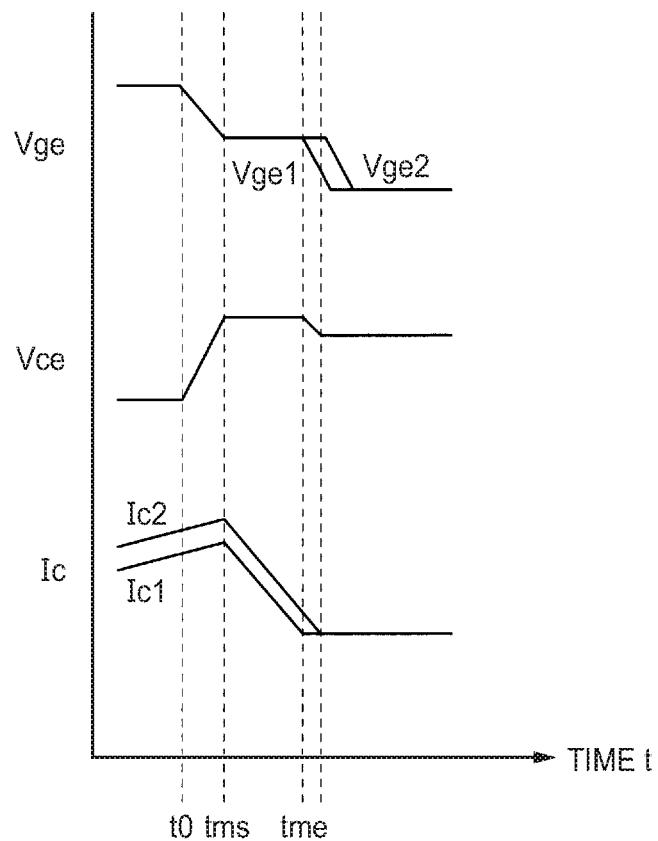
FIG. 23 is a diagram illustrating a timing chart at a time of an OFF control of the electric circuit according to the related art.
Figure 24:
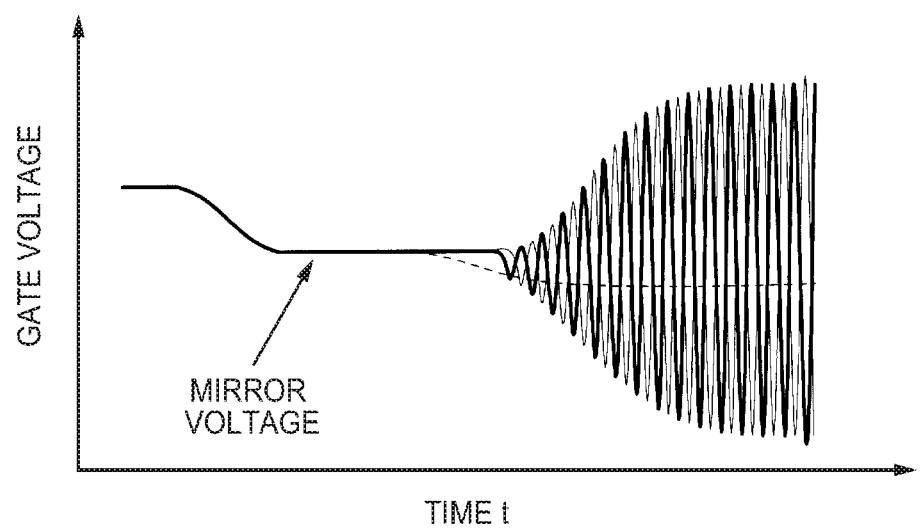
FIG. 24 is a diagram showing an oscillation at the time of the OFF control of the electric circuit according to the related art.

In addition, the oscillation might arise even when the IGBT1 and the IGBT2 are turned OFF. When the IGBT1 and the IGBT2 remain in ON states before time t0, the collector currents Ic1, Ic2 increase as illustrated in FIG. 23. The inductances L1, L2 are present on the respective emitter sides of the IGBT1 and the IGBT2, and the voltages VL1, VL2 generated in the inductances L1, L2 rise with the increase in the collector currents Ic1, Ic2. Accordingly, the emitter voltages of the IGBT1 and the IGBT2 temporally rise as well. In a case where the inductance L1 is larger than the inductance L2, the current that flows through the inductance L1 falls short of the current that flows through the inductance L2. In a case where a control for turning OFF the IGBT1 and the IGBT2 is initiated at time t0 in this state, the gate voltages Vge1, Vge2 of the IGBT1 and the IGBT2 fall. In a case where the collector currents Ic1, Ic2 are small, the collector currents Ic1, Ic2 continue to increase and a collector voltage does not rise. Once the gate voltages Vge1, Vge2 reach the mirror voltage at time tms, the collector currents Ic1, Ic2 begin to decrease and the collector voltage rises. Once the mirror period is over at time tme, the IGBT1 is turned OFF first, and a negative voltage generated in the inductance L1 becomes 0. Once the emitter voltage of the IGBT1 rises as a result thereof, the gate voltage Vge1 increases and the IGBT1 is put back into the ON state for the presence of a parasitic capacitance between the gate and the emitter of the IGBT1. This causes some of the collector current Ic2 to flow as the collector current Ic1, the collector current Ic2 to decrease, and the voltage of the inductance L2 to fall. Once the emitter voltage of the IGBT2 rises as a result thereof, the gate voltage Vge2 increases for a parasitic capacitance between the gate and the emitter of the IGBT2. This causes some of the collector current Ic1 to flow as the collector current Ic2, the collector current Ic1 to decrease, and the voltage of the inductance L1 to fall. The oscillation occurs in the circuit as a result thereof. FIG. 24 shows a time-dependent change in the gate voltage at a time when the IGBT1 and the IGBT2 are turned OFF. Ideally, the gate voltage does not oscillate, as illustrated by the dashed line in FIG. 24, when the IGBT1 and the IGBT2 are turned OFF. When the inductances L1, L2 of the emitter wiring (source wiring) of the IGBT1 and the IGBT2 have a deviation, however, the oscillation is likely to be caused with the balance of the currents flowing through the IGBT1 and the IGBT2 collapsed, as illustrated by the solid line in FIG. 24, when the gate voltage is close to the mirror voltage.

In a case where switching elements have short emitter wiring, an inductance difference is small, negligible in some cases. When the switching elements have long emitter wiring, however, a difference between the lengths of the emitter wiring of the respective elements is likely to be large. As a result, the inductance difference between the emitter wiring is likely to increase as well.

Figure 1:
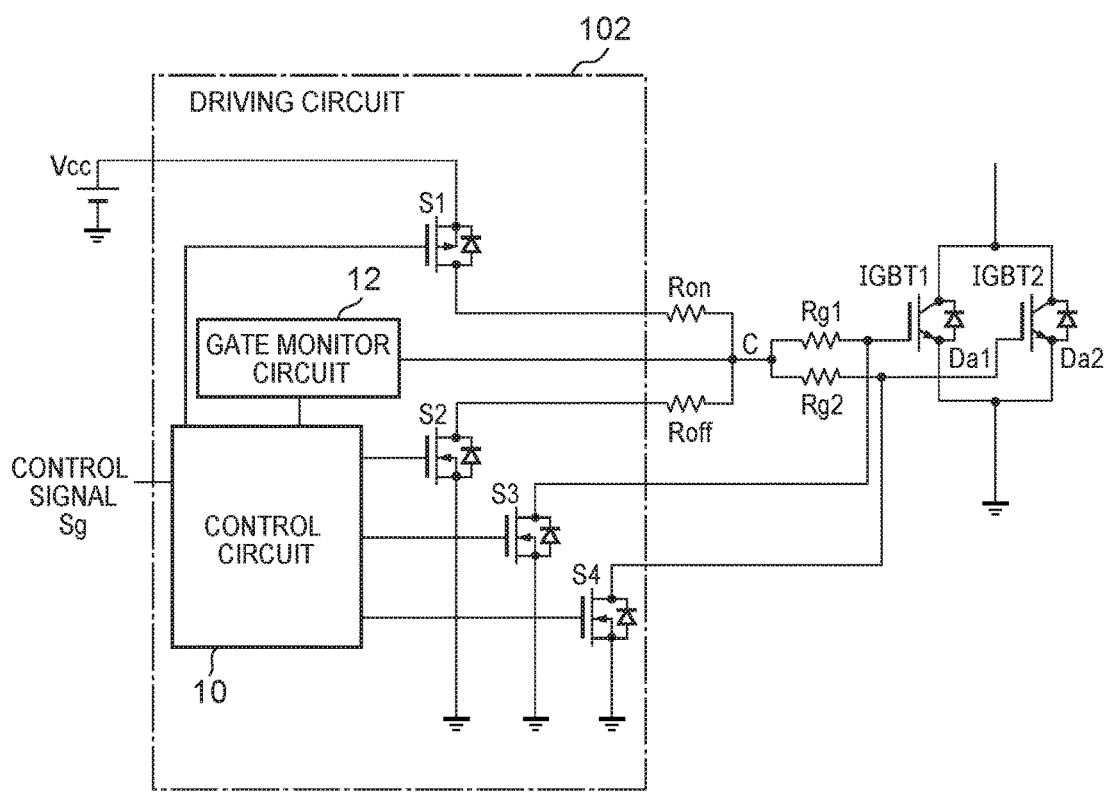
FIG. 1 is a diagram illustrating a configuration of an electric circuit according to a first embodiment.

As illustrated in FIG. 1, an electric circuit 100 according to a first embodiment is configured to include the switching elements IGBT1, IGBT2 and a driving circuit 102.

The switching elements IGBT1, IGBT2 are connected in parallel. In other words, collector terminals of the switching elements IGBT1, IGBT2 are connected in common to each other. In addition, emitter terminals of the switching elements IGBT1, IGBT2 are connected in common to each other, too. Furthermore, the gate terminals of the switching elements IGBT1, IGBT2 are connected in common to a connection point C via resistors Rg1, Rg2 for resonance suppression, respectively. Moreover, the collector terminals and the emitter terminals of the switching elements IGBT1, IGBT2 are connected via diodes Da1, Da2 for reflux, respectively.

The driving circuit 102 is configured to include a switching element S1 for ON, a switching element S2 for OFF, switching elements S3, S4 for high speed gate OFF, a control circuit 10, and a gate monitor circuit 12.

The switching element S1 for ON is an element for putting the switching elements IGBT1, IGBT2 into the ON states by applying a control voltage to the gate terminals of the switching elements IGBT1, IGBT2. A voltage that is supplied from an electric power source voltage Vcc is applied to a source terminal of the switching element S1 for ON. A drain terminal of the switching element S1 for ON is connected to the connection point C of the switching elements IGBT1, IGBT2 via a resistor Ron for gate ON. A voltage of a gate terminal of the switching element S1 for ON is controlled by the control circuit 10.

The switching element S2 for OFF is an element for putting the switching elements IGBT1, IGBT2 into OFF states by grounding the gate terminals of the switching elements IGBT1, IGBT2. A drain terminal of the switching element S2 for OFF is connected to the connection point C of the switching elements IGBT1, IGBT2 via a resistor Roff for gate OFF. A source terminal of the switching element S2 for OFF is grounded. A voltage of a gate terminal of the switching element S2 for OFF is controlled by the control circuit 10.

The switching element S3 for high speed gate OFF is an element for putting the switching element IGBT1 into the OFF state at a high speed. A drain terminal of the switching element S3 for high speed gate OFF is directly connected to the gate terminal of the switching element IGBT1. A source terminal of the switching element S3 for high speed gate OFF is grounded. A voltage of a gate terminal of the switching element S3 for high speed gate OFF is controlled by the control circuit 10. The switching element S4 for high speed gate OFF is an element for putting the switching element IGBT2 into the OFF state at a high speed. A drain terminal of the switching element S4 for high speed gate OFF is directly connected to the gate terminal of the switching element IGBT2. A source terminal of the switching element S4 for high speed gate OFF is grounded. A voltage of a gate terminal of the switching element S4 for high speed gate OFF is controlled by the control circuit 10. In this embodiment, the drain terminal of the switching element S3 for high speed gate OFF and the gate terminal of the switching element IGBT1 are directly connected to each other, and these may be connected via a resistor with a resistance value that is lower than the sum of the resistor Rg1 for resonance suppression and the resistor Roff for gate OFF. Likewise, the drain terminal of the switching element S4 for high speed gate OFF and the gate terminal of the switching element IGBT2 are directly connected to each other, and these may be connected via a resistor with a resistance value that is lower than the sum of the resistor Rg2 for resonance suppression and the resistor Roff for gate OFF.

The gate monitor circuit 12 detects a voltage of the connection point C as a gate voltage Vg of the switching elements IGBT1, IGBT2 and outputs it to the control circuit 10. The control circuit 10 controls the switching elements IGBT1, IGBT2 to be turned ON or OFF based on the gate voltage Vg detected by the gate monitor circuit 12.

Figure 2:
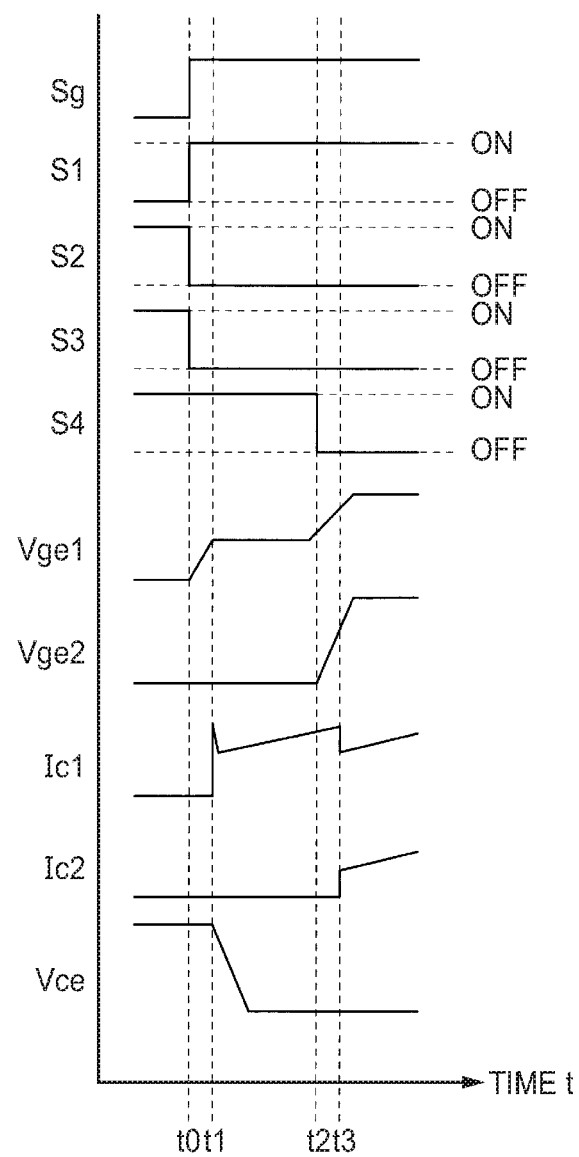
FIG. 2 is a diagram illustrating a timing chart at a time of an ON control according to the first embodiment.

Hereinafter, the control for the electric circuit 100 to put the switching elements IGBT1, IGBT2 into the ON states will be described with reference to the timing chart that is illustrated in FIG. 2.

The OFF state of the switching element refers to a state where the voltage applied to the gate terminal falls short of a threshold voltage and no current flows through the switching element in substance. In addition, the ON state of the switching element refers to a state where the voltage applied to the gate terminal is equal to or higher than the threshold voltage and the current flows through the switching element in substance.

Before the control is initiated, the gate terminals of the switching elements IGBT1, IGBT2 are grounded and both are maintained in the OFF states. In other words, the switching element S1 for ON is in the OFF state, the switching element S2 for OFF is in the ON state, and the switching element S3 for high speed gate OFF and the switching element S4 for high speed gate OFF are in the ON states.

At time t0, the control circuit 10 receives a control signal Sg from the outside and initiates the control for putting the switching elements IGBT1, IGBT2 into the ON states in response to the control signal Sg. At time t0, the control circuit 10 puts the switching element S1 for ON into the ON state, the switching element S2 for OFF into the OFF state, and the switching element S3 for high speed gate OFF into the OFF state. At this time, the switching element S4 for high speed gate OFF is maintained in the ON state.

Then, the voltage supplied from the electric power source voltage Vcc is applied to the gate terminal of the switching element IGBT1 via the resistor Ron for gate ON and the resistor Rg1 for resonance suppression, and the voltage Vge1 of the gate terminal of the switching element IGBT1 gradually rises. At this time, the voltage of the connection point C is measured by the gate monitor circuit 12 and is input to the control circuit 10 as the gate voltage Vg.

The voltage Vge1 of the gate terminal rises as a capacitor of the gate terminal of the switching element IGBT1 is charged. At time t1, the voltage Vge1 exceeds the threshold voltage and the switching element IGBT1 is put into the ON state. Then, the collector current Ic1 of the switching element IGBT1 begins to flow. At this time, the switching element IGBT2 still remains in the OFF state. In other words, a stand-by period in which the switching element IGBT1 is in the ON state and the switching element IGBT2 is in the OFF state is provided.

Then, the control circuit 10 puts the switching element S4 for high speed gate OFF into the OFF state once the voltage Vge1 of the gate terminal of the switching element IGBT1 exceeds the mirror voltage at time t2. In other words, the control circuit 10 puts the switching element S4 for high speed gate OFF into the OFF state in a case where the gate voltage Vg of the connection point C measured by the gate monitor circuit 12 exceeds a value at a time when the voltage Vge1 of the gate terminal of the switching element IGBT1 becomes equal to the mirror voltage.

Then, the voltage supplied from the electric power source voltage Vcc is applied to the gate terminal of the switching element IGBT2 via the resistor Ron for gate ON and the resistor Rg2 for resonance suppression, and the voltage Vge2 of the gate terminal of the switching element IGBT2 gradually rises. The voltage Vge2 of the gate terminal rises as a capacitor of the gate terminal of the switching element IGBT2 is charged. At time t3, the voltage Vge2 exceeds the threshold voltage and the switching element IGBT2 is put into the ON state. Then, the collector current Ic2 of the switching element IGBT2 begins to flow. The electric circuit 100 is put into the ON state through the above-described processing.

As described above, in the electric circuit 100 according to this embodiment, the switching element IGBT1 is put into the ON state before the switching element IGBT2 is put into the ON state when the switching elements IGBT1, IGBT2 are put into the ON states. Accordingly, the voltage Vge1 and the voltage Vge2 of the gate terminals are prevented from becoming close to the mirror voltage at the same time in the ON control stand-by period, and the oscillations of the switching elements IGBT1, IGBT2 can be suppressed. At this time, the voltage Vge1 and the voltage Vge2 of the gate terminals can be more reliably prevented from becoming close to the mirror voltage at the same time by the stand-by period being provided until the voltage Vge1 of the gate terminal of the switching element IGBT1 exceeds the mirror voltage in particular.

Figure 3:
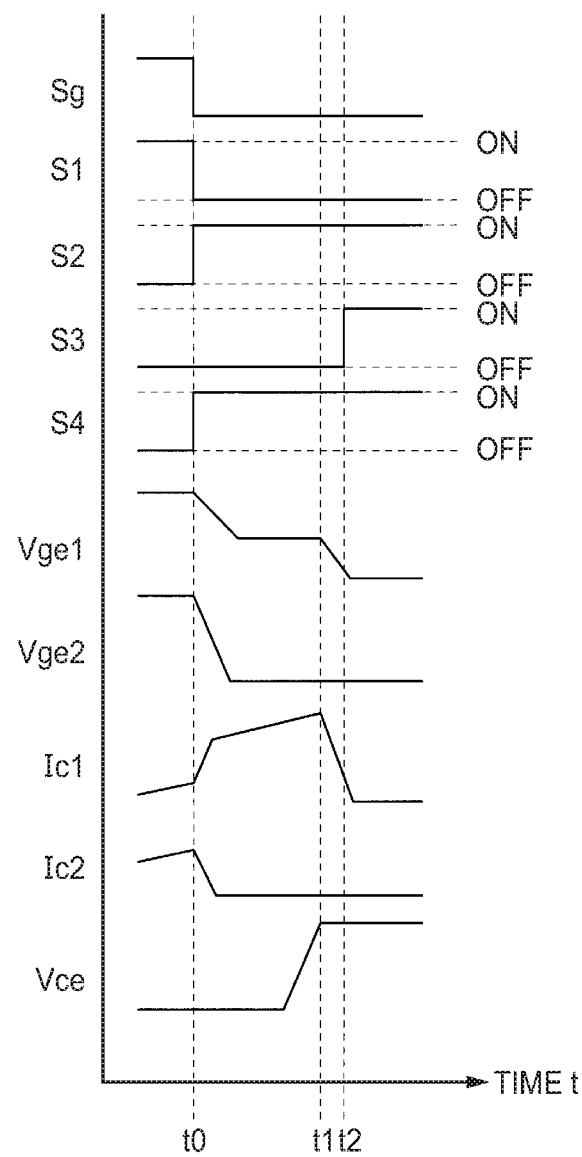
FIG. 3 is a diagram illustrating a timing chart at a time of an OFF control according to the first embodiment.

Hereinafter, the control for the electric circuit 100 to put the switching elements IGBT1, IGBT2 into the OFF states will be described with reference to the timing chart that is illustrated in FIG. 3.

Before the control is initiated, both the switching elements IGBT1, IGBT2 are maintained in the ON states. In other words, the switching element S1 for ON is in the ON state, the switching element S2 for OFF is in the OFF state, and the switching element S3 for high speed gate OFF and the switching element S4 for high speed gate OFF are in the OFF states.

Once the control signal Sg is given from the outside at time t0, the control circuit 10 initiates the control for putting the switching elements IGBT1, IGBT2 into the OFF states in response to the control signal Sg. At time t0, the control circuit 10 puts the switching element S1 for ON into the OFF state, the switching element S2 for OFF into the ON state, and switching element S4 for high speed gate OFF into the ON state. At this time, the switching element S3 for high speed gate OFF is maintained in the OFF state.

Then, the gate terminal of the switching element IGBT2 is grounded via the switching element S4 for high speed gate OFF, and the voltage Vge2 of the gate terminal of the switching element IGBT2 decreases rapidly. The gate terminal of the switching element IGBT1 is grounded via the resistor Roff for gate OFF and the resistor Rg1 for resonance suppression, and the voltage Vge1 of the gate terminal of the switching element IGBT1 decreases more slowly than the voltage Vge2 of the gate terminal of the switching element IGBT2. The voltage Vge1 of the gate terminal temporarily stops falling in the period of time t0 to time t1 and is maintained at the substantially constant mirror voltage. In other words, the stand-by period in which the switching element IGBT2 is in the OFF state and the switching element IGBT1 is in the ON state is provided.

As the voltage Vge2 of the gate terminal of the switching element IGBT2 falls, the collector current Ic2 of the switching element IGBT2 also decreases and the OFF state is reached. The current flowing through the switching element IGBT2 flows through the switching element IGBT1 as well, and the collector current Ic1 of the switching element IGBT1 temporarily increases. Then, the voltage Vge1 of the gate terminal of the switching element IGBT1 also continues to fall, and the collector current Ic1 of the switching element IGBT1 also begins to fall at time t1.

The control circuit 10 puts the switching element S3 for high speed gate OFF into the ON state once the voltage Vge1 of the gate terminal of the switching element IGBT1 falls short of the mirror voltage at time t2. In other words, the control circuit 10 puts the switching element S3 for high speed gate OFF into the ON state in a case where the gate voltage Vg of the connection point C measured by the gate monitor circuit 12 becomes equal to or lower than the value at the time when the voltage Vge1 of the gate terminal of the switching element IGBT1 becomes equal to the mirror voltage. When the voltage Vge1 of the gate terminal falls short of the mirror voltage, only a small current flows through the switching element IGBT1 and Vce rises. This causes the gate terminal of the switching element IGBT1 to be grounded via the switching element S3 for high speed gate OFF and the voltage Vge1 of the gate terminal of the switching element IGBT1 to decrease more rapidly than before. Subsequently, the switching element IGBT1 is completely put into the OFF state.

As described above, the switching element IGBT2 is put into the OFF state before the switching element IGBT1 is put into the OFF state when the switching elements IGBT1, IGBT2 are put into the OFF states. Accordingly, even in the case of the OFF state, the voltage Vge1 and the voltage Vge2 of the gate terminals are prevented from becoming close to the mirror voltage at the same time and the oscillations of the switching elements IGBT1, IGBT2 can be suppressed. By the stand-by period being provided until the voltage Vge1 of the gate terminal of the switching element IGBT1 falls short of the mirror voltage at this time, excessive voltage generation in Vce at a time when the rest of the switching elements is turned OFF can be suppressed. In addition, the voltage Vge1 and the voltage Vge2 of the gate terminals can be more reliably prevented from becoming close to the mirror voltage at the same time by the stand-by period being provided until the voltage Vge1 of the gate terminal of the switching element IGBT1 becomes equal to or lower than the threshold voltage.

Figure 4:
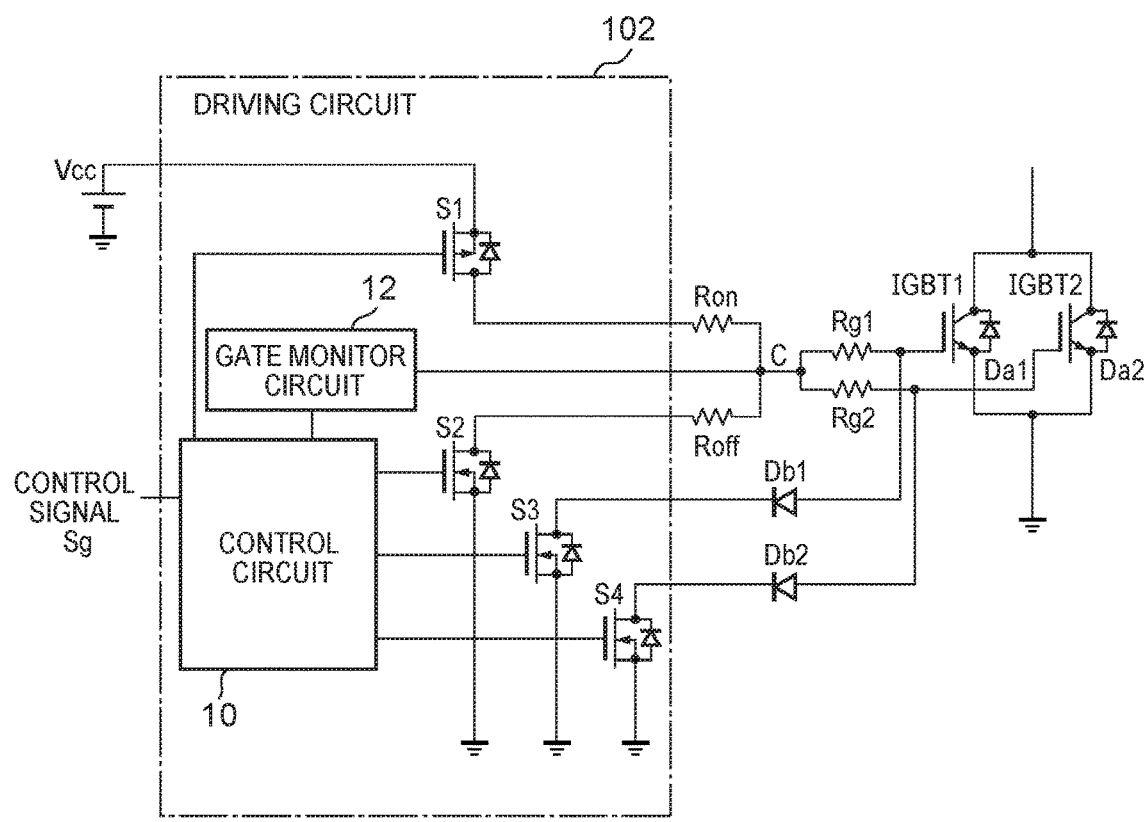
FIG. 4 is a diagram illustrating a configuration of a modification example of the electric circuit according to the first embodiment.

In the electric circuit according to this embodiment, diodes Db1, Db2 may be disposed between the gate terminal of the switching element IGBT1 and the switching element S3 for high speed gate OFF and between the gate terminal of the switching element IGBT2 and the switching element S4 for high speed gate OFF as illustrated in the form of an electric circuit 104 in FIG. 4, respectively. The diode Db1 is connected in series to the switching element S3 for high speed gate OFF, and the diode Db2 is connected in series to the switching element S4 for high speed gate OFF. This allows a resonance resulting from capacitance of the gates of the switching elements IGBT1, IGBT2 and a parasitic inductance in the wiring of the gate terminals to be suppressed when the switching element S3 for high speed gate OFF and the switching element S4 for high speed gate OFF are in the ON states.

Figure 5:
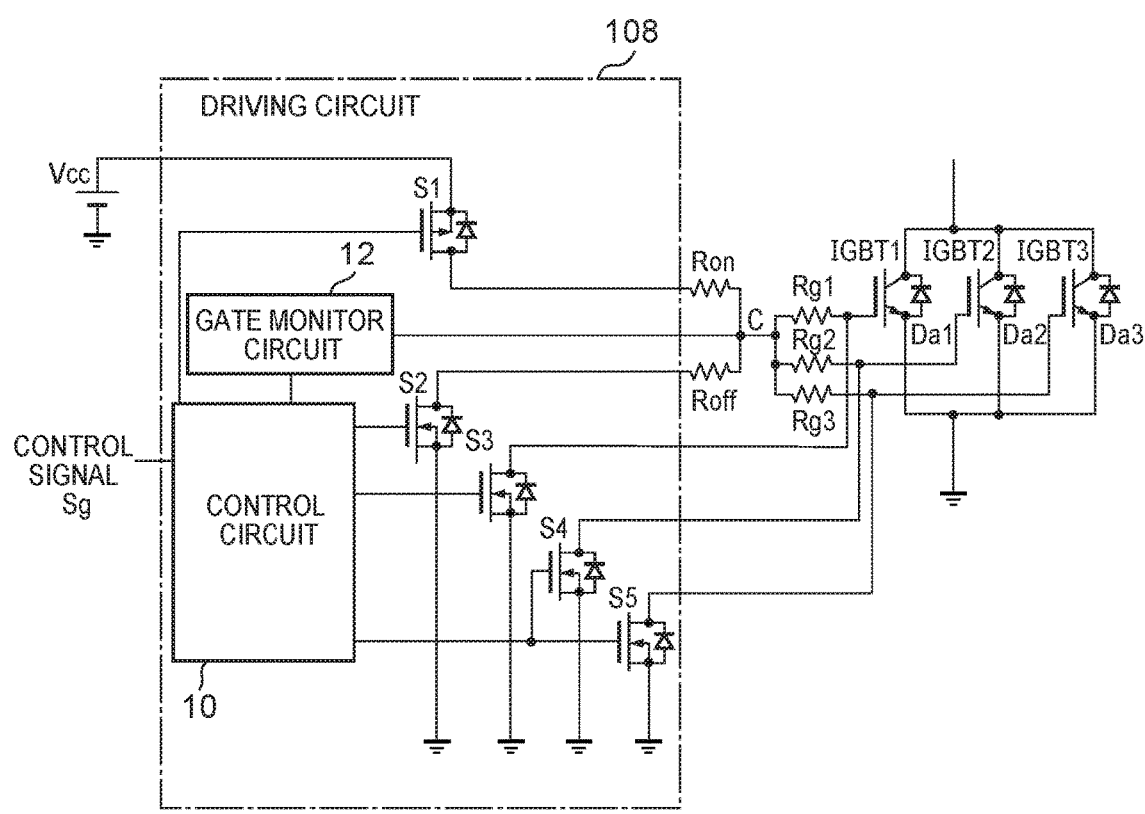
FIG. 5 is a diagram illustrating the configuration of the modification example of the electric circuit according to the first embodiment.

In addition, three or more switching elements may be connected in parallel. For example, a configuration in which not only the switching elements IGBT1, IGBT2 but also a switching element IGBT3 is connected in parallel is also possible as illustrated in the form of an electric circuit 106 in FIG. 5. In this case, a switching element S5 for high speed gate OFF for putting the switching element IGBT3 into the OFF state at a high speed is additionally disposed in a driving circuit 108. A drain terminal of the switching element S5 for high speed gate OFF is directly connected to a gate terminal of the switching element IGBT3. A source terminal of the switching element S5 for high speed gate OFF is grounded. A voltage of a gate terminal of the switching element S5 for high speed gate OFF is controlled by the control circuit 10. In this embodiment, the drain terminal of the switching element S5 for high speed gate OFF and the gate terminal of the switching element IGBT3 are directly connected to each other, and these may be connected via a resistor with a resistance value that is lower than the sum of a resistor Rg3 for resonance suppression and the resistor Roff for gate OFF.

In a case where the switching elements IGBT1, IGBT2, IGBT3 are controlled to be put into the ON states from the OFF states, the control circuit 10 puts the switching element S1 for ON into the ON state, puts the switching element S2 for OFF into the OFF state, puts the switching element S3 for high speed gate OFF into the OFF state, and maintains the switching elements S4, S5 for high speed gate OFF in the ON states. Then, the control circuit 10 puts the switching elements S4, S5 for high speed gate OFF into the OFF states at a point in time when the voltage Vge1 of the gate terminal of the switching element IGBT1 exceeds the mirror voltage after rising. Then, the voltages Vge1 to Vge3 of the gate terminals of all the switching elements IGBT1, IGBT2, IGBT3 are prevented from becoming close to the mirror voltage at the same time, and the oscillations of the switching elements IGBT1, IGBT2, IGBT3 can be suppressed.

In a case where the switching elements IGBT1, IGBT2, IGBT3 are controlled to be put into the OFF states from the ON states, the control circuit 10 puts the switching element S1 for ON into the OFF state, puts the switching element S2 for OFF into the ON state, puts the switching elements S4, S5 for high speed gate OFF into the ON states, and maintains the switching element S3 for high speed gate OFF in the OFF state. Then, the control circuit 10 puts the switching element S3 for high speed gate OFF into the ON state at a point in time when the voltages Vge2, Vge3 of the gate terminals of the switching elements IGBT2, IGBT3 fall short of the mirror voltage after falling. Then, the voltages Vge1 to Vge3 of the gate terminals of all the switching elements IGBT1 IGBT2, IGBT3 are prevented from becoming close to the mirror voltage at the same time, and the oscillations of the switching elements IGBT1, IGBT2, IGBT3 can be suppressed.

Figure 6:
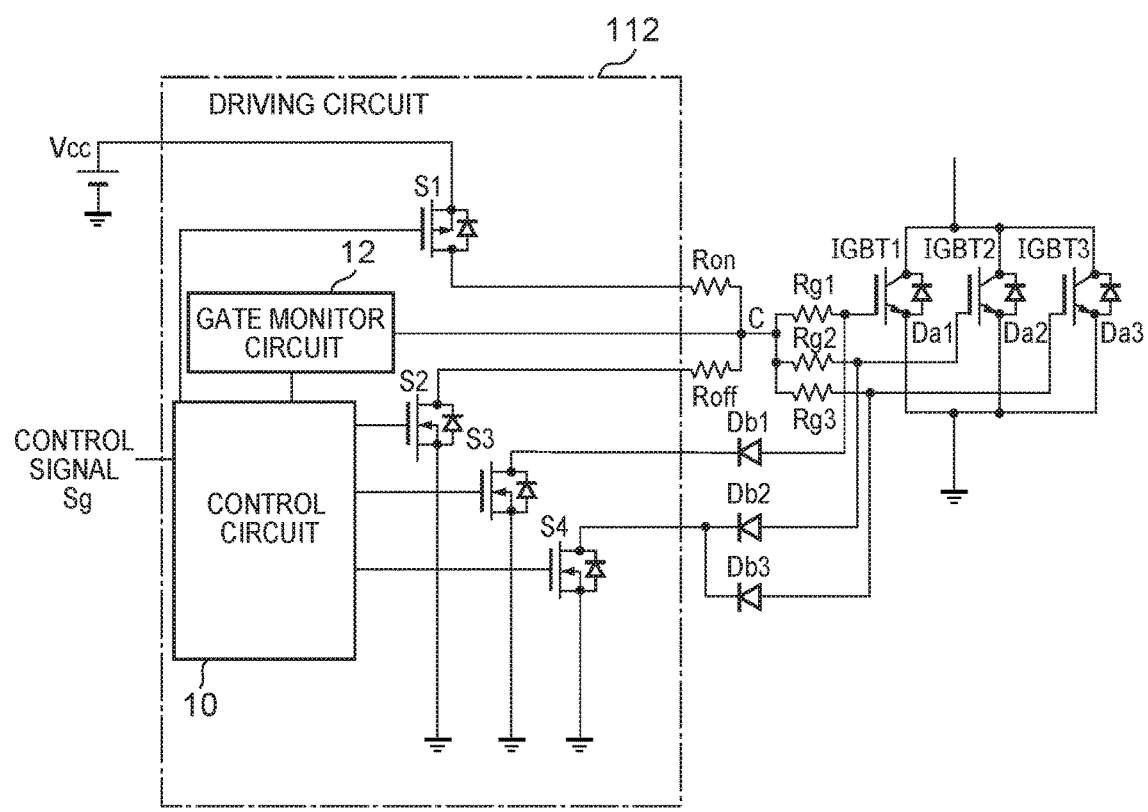
FIG. 6 is a diagram illustrating the configuration of the modification example of the electric circuit according to the first embodiment.

Diodes Db1, Db2, Db3 may be disposed between the gate terminals of the switching elements IGBT1, IGBT2, IGBT3 and the switching elements S3, S4 for high speed gate OFF as illustrated in the form of an electric circuit 110 in FIG. 6, respectively. The diode Db1 is connected in series to the switching element S3 for high speed gate OFF, and the diodes Db2, Db3 are connected in series to the switching element S4 for high speed gate OFF. This allows a resonance resulting from capacitance of the gates of the switching elements IGBT1, IGBT2, IGBT3 and a parasitic inductance in the wiring of the gate terminals to be suppressed when the switching elements S3, S4 for high speed gate OFF are in the ON states. At this time, the switching element S4 for high speed gate OFF with respect to the switching elements IGBT2, IGBT3 can be in common in a driving circuit 112.

Figure 7:
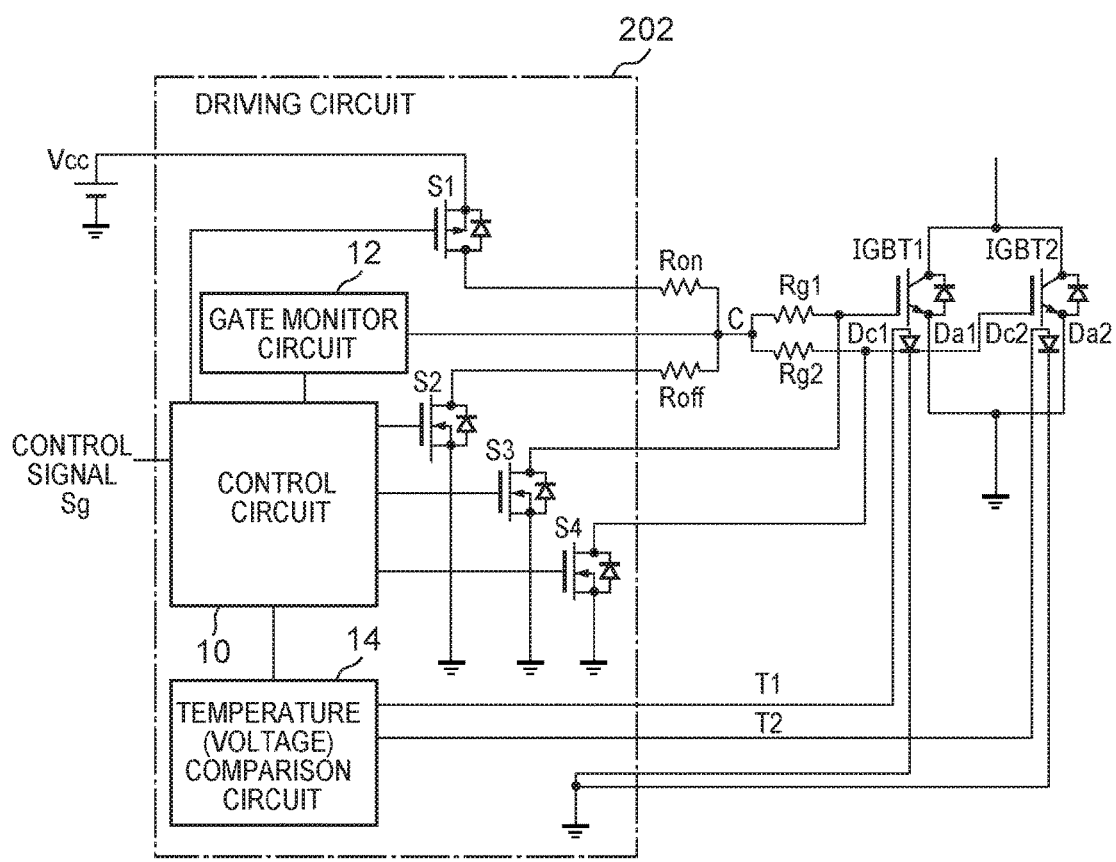
FIG. 7 is a diagram illustrating a configuration of an electric circuit according to a second embodiment.

As illustrated in FIG. 7, an electric circuit 200 according to a second embodiment is configured to include the switching elements IGBT1, IGBT2, temperature sensors Dc1, Dc2, and a driving circuit 202. The electric circuit 200 differs from the electric circuit 100 in that the electric circuit 200 is provided with the temperature sensors Dc1, Dc2 and in respect of the configuration and control method of the driving circuit 202. Accordingly, the following description will focus on these differences with the same reference numerals used to refer to the same configurational components as in the electric circuit 100 and description thereof be omitted.

The temperature sensors Dc1, Dc2 are temperature detection means for detecting and outputting the temperatures of the switching elements IGBT1, IGBT2, respectively. The temperature sensor Dc1, which is placed in the vicinity of the switching element IGBT1, measures the temperature T1 of the switching element IGBT1 and outputs the temperature T1 to a temperature comparison circuit (voltage comparison circuit) 14 included in the driving circuit 202. The temperature sensor Dc2, which is placed in the vicinity of the switching element IGBT2, measures the temperature T2 of the switching element IGBT2 and outputs the temperature T2 to the temperature comparison circuit 14. The temperature sensors Dc1, Dc2 can be, for example, diodes that have a resistance value depending on the temperature and output a terminal voltage in accordance with the temperature. In addition, the temperature sensors Dc1, Dc2 may be polysilicon-based resistive elements or external temperature detection elements.

The driving circuit 202 is configured to include the temperature comparison circuit 14. The temperature comparison circuit 14 compares the temperature T1 of the switching element IGBT1 input from the temperature sensor Dc1 and the temperature T2 of the switching element IGBT2 input from the temperature sensor Dc2 to each other and outputs a signal showing which one of the temperatures is higher than the other to the control circuit 10. In a case where the temperature sensors Dc1, Dc2 are the diodes, the temperature comparison circuit 14 compares the voltages that are output from both of the diodes to each other and outputs a signal showing which one of the temperatures of the switching elements IGBT1, IGBT2 is higher than the other to the control circuit 10.

The control circuit 10 sets, in accordance with the signal from the temperature comparison circuit 14, one of the switching elements IGBT1, IGBT2 that is to be put into the ON state or the OFF state prior to the other during the ON control or the OFF control.

Figure 8:
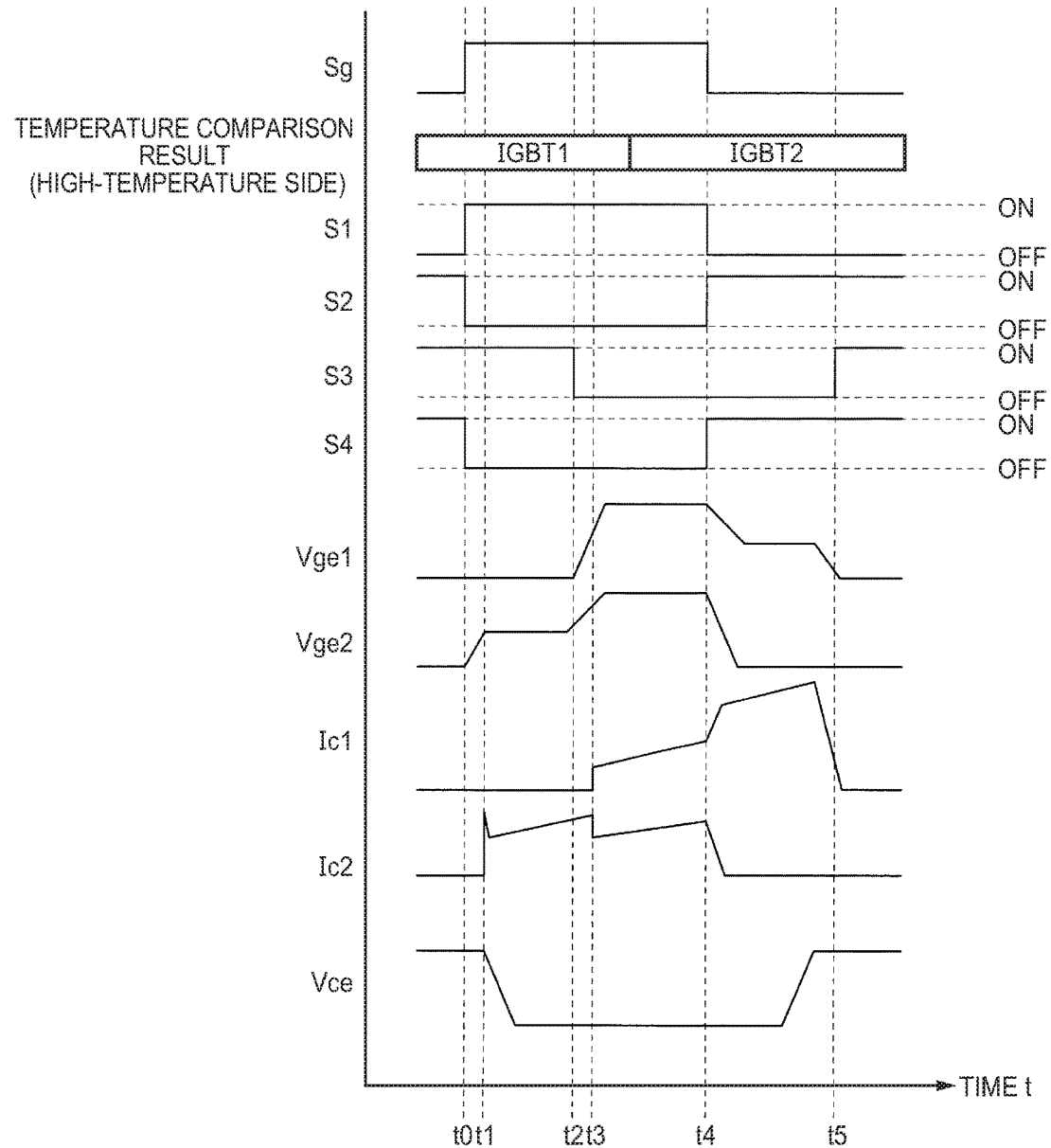
FIG. 8 is a diagram illustrating a timing chart at a time of an ON control and a time of an OFF control according to the second embodiment.

Hereinafter, the control for the electric circuit 200 to put the switching elements IGBT1, IGBT2 into the ON state and the OFF state will be described with reference to the timing chart that is illustrated in FIG. 8.

In a case where the switching elements IGBT1, IGBT2 are put into the ON states from the OFF states, the control signal Sg is received from the outside and the control for putting the switching elements IGBT1, IGBT2 into the ON states in accordance with the control signal Sg is initiated at time t0. The control circuit 10 controls one of the switching elements IGBT1, IGBT2 that is lower in temperature than the other to be put into the ON state prior to the other one in accordance with the signal from the temperature comparison circuit 14. In the example that is illustrated in FIG. 8, the switching element IGBT2 is controlled to be put into the ON state first as the temperature of the switching element IGBT1 is higher than the temperature of the switching element IGBT2. In other words, at time t0, the control circuit 10 puts the switching element S1 for ON into the ON state and puts the switching element S2 for OFF into the OFF state. In addition, the control circuit 10 maintains the switching element S3 for high speed gate OFF in the ON state and puts the switching element S4 for high speed gate OFF into the OFF state.

Then, the voltage supplied from the electric power source voltage Vcc is applied to the gate terminal of the switching element IGBT2 via the resistor Ron for gate ON and the resistor Rg2 for resonance suppression, and the switching element IGBT2 is put into the ON state first at time t1. Subsequently, the control circuit 10 puts the switching element S3 for high speed gate OFF into the OFF state once the voltage Vge2 of the gate terminal of the switching element IGBT2 exceeds the mirror voltage at time t2. Then, the voltage supplied from the electric power source voltage Vcc is applied to the gate terminal of the switching element IGBT1 via the resistor Ron for gate ON and the resistor Rg1 for resonance suppression, and the switching element IGBT1 is put into the ON state at time t3 after the switching element IGBT2 is put into the ON state.

In a case where the switching elements IGBT1, IGBT2 are put into the OFF states from the ON states, the control signal Sg is received from the outside and the control for putting the switching elements IGBT1, IGBT2 into the OFF states in accordance with the control signal Sg is initiated. The control circuit 10 controls one of the switching elements IGBT1, IGBT2 that is higher in temperature than the other to be put into the OFF state prior to the other one in accordance with the signal from the temperature comparison circuit 14. In the example that is illustrated in FIG. 8, the switching element IGBT2 is controlled to be put into the OFF state first as the temperature of the switching element IGBT2 is higher than the temperature of the switching element IGBT1. At time t4, the control circuit 10 puts the switching element S1 for ON into the OFF state and puts the switching element S2 for OFF into the ON state. In addition, the control circuit 10 maintains the switching element S3 for high speed gate OFF in the OFF state and puts the switching element S4 for high speed gate OFF into the ON state.

Then, the gate terminal of the switching element IGBT1 is grounded via the resistor Roff for gate OFF and the resistor Rg1 for resonance suppression and the gate terminal of the switching element IGBT2 is grounded via the switching element S4 for high speed gate OFF. Accordingly, the switching element IGBT2 is put into the OFF state before the switching element IGBT1 is put into the OFF state. Subsequently, the control circuit 10 puts the switching element S3 for high speed gate OFF into the ON state once the voltage Vge2 of the gate terminal of the switching element IGBT2 falls short of the mirror voltage at time t5. This causes the gate terminal of the switching element IGBT1 to be grounded via the switching element S3 for high speed gate OFF, and then the switching element IGBT1 is put into the OFF state after the switching element IGBT2 is put into the OFF state.

As described above, the one that is lower in temperature than the other one is put into the ON state first when the switching elements IGBT1, IGBT2 are put into the ON states. Accordingly, an electric power loss (ON loss) at a time of the ON control can be imposed on the switching element that is lower in temperature than the other one, and a temperature deviation between the switching elements can be prevented and the oscillation of the element can be suppressed. In addition, the one that is higher in temperature than the other one is put into the OFF state first when the switching elements IGBT1, IGBT2 are put into the OFF states. Accordingly, an electric power loss (OFF loss) at a time of the OFF control can be imposed on the switching element that is lower in temperature than the other one, and the temperature deviation between the switching elements can be prevented and the oscillation of the element can be suppressed.

In a case where the number of the switching elements that are connected in parallel is three or more, the switching element that is put into the ON state first during the ON control of the switching elements may be one of the elements lower in temperature than at least one of the rest of the switching elements. In addition, in the case where the number of the switching elements that are connected in parallel is three or more, at least one of the switching elements other than the switching element put into the OFF state first may include the element lower in temperature than the switching element put into the OFF state first during the OFF control for the switching elements.

Figure 25:
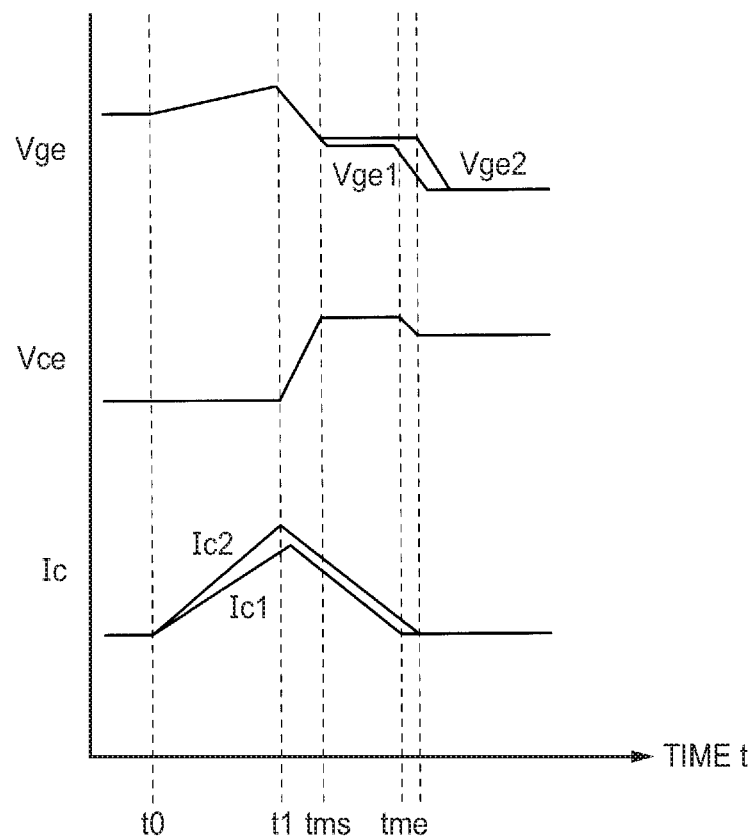
FIG. 25 is a diagram illustrating a timing chart at a time of an OFF control attributable to a short circuit occurrence in the electric circuit according to the related art.

In the circuit configuration according to the related art that is illustrated in FIG. 20, the oscillation might arise even in the case of short circuits of the IGBT1 and the IGBT2. As illustrated in FIG. 25, the collector currents Ic2, Ic2 increase when the short circuits occur in the IGBT1 and the IGBT2 at time t0. The inductances L1, L2 are present on the respective emitter sides of the IGBT1 and the IGBT2, and the voltages VL1, VL2 generated in the inductances L1, L2 rise with the increase in the collector currents Ic1, Ic2. Accordingly, the emitter voltages of the IGBT1 and the IGBT2 temporally rise as well. In a case where the inductance L1 is larger than the inductance L2, the current that flows through the inductance L1 falls short of the current that flows through the inductance L2. In a case where a control for reducing the gate voltages Vge1, Vge2 of the IGBT1 and the IGBT2 is initiated at time t1 in this state, the gate voltages Vge1, Vge2 fall and the currents Ic1, Ic2 fall at the same time provided that the collector currents Ic1, Ic2 are large, and the collector voltage rises. At this time, the collector current of the IGBT2 that is relatively larger is reduced first. Once the gate voltages Vge1, Vge2 decrease thereafter, the IGBT2, through which a larger amount of current flows, begins to be turned OFF first, and the voltage generated in the inductance L2 becomes negative and the gate voltage Vge2 rises as the current of the IGBT2 is reduced. The current is still on the increase in the IGBT1, and the voltage generated in the inductance L1 becomes positive and the gate voltage Vge1 is reduced. The current Ic2 that flows through the IGBT2 increases as the gate voltage Vge2 rises, and the current Ic1 that flows through the IGBT1 decreases as the gate voltage Vge1 is reduced. Once the current Ic2 increases, the voltage of the inductance L2 rises and the gate voltage Vge2 falls. In addition, once the current Ic1 decreases, the voltage of the inductance L1 falls and the gate voltage Vge1 rises. In this manner, the gate voltage Vge1 of the IGBT1 and the gate voltage Vge2 of the IGBT2 temporally change places in their magnitude relationship, resulting in the oscillation in the circuit. Nevertheless, the gates of the IGBT1 and the IGBT2 remain discharged in the control circuit 20, the gate voltages Vge1, Vge2 gradually decrease, and the oscillation stops once both the IGBT1 and the IGBT2 reach the mirror period.

Figure 9:
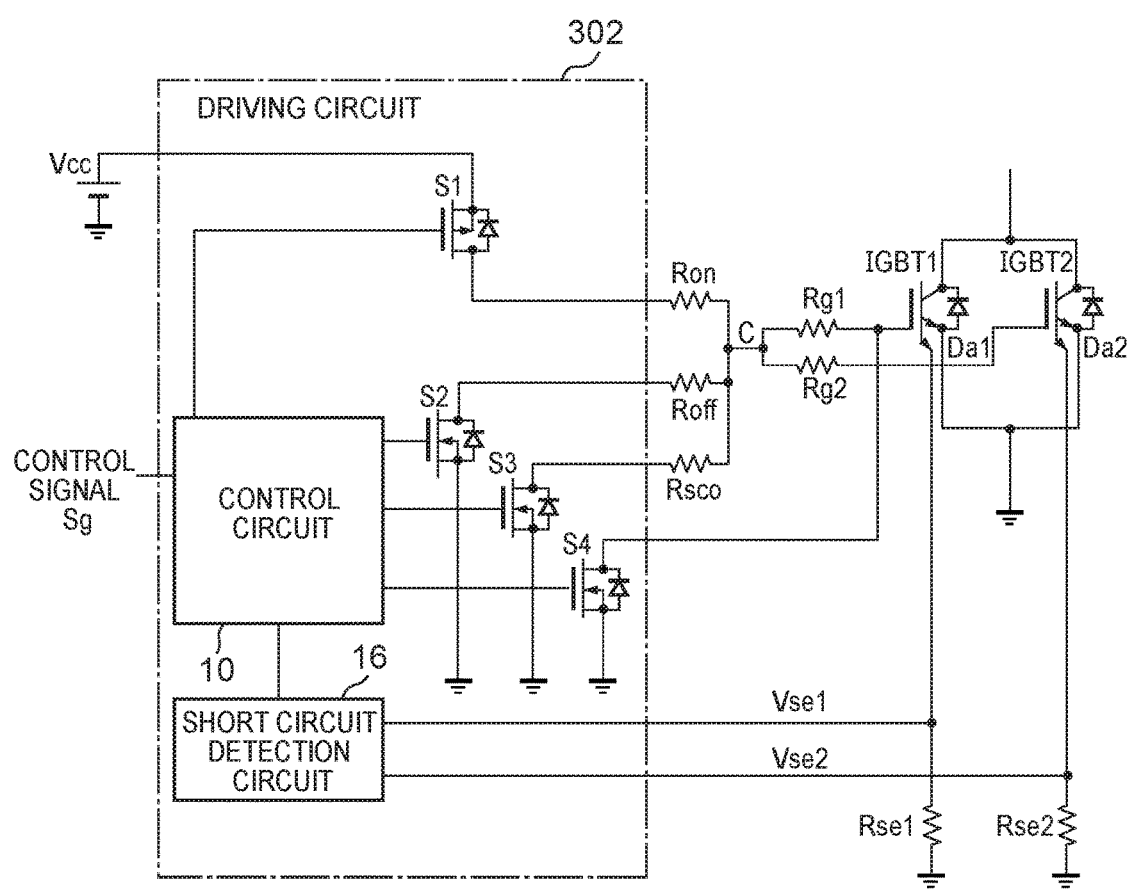
FIG. 9 is a diagram illustrating a configuration of an electric circuit according to a third embodiment.

As illustrated in FIG. 9, an electric circuit 300 according to a third embodiment is configured to include the switching elements IGBT1, IGBT2, current sense resistors Rse1, Rse2, and a driving circuit 302. The electric circuit 300 differs from the electric circuit 100 in that the electric circuit 300 is provided with a soft shutdown resistor Rsco and the current sense resistors Rse1, Rse2 and in respect of the configuration and control method of the driving circuit 302. Accordingly, the following description will focus on these differences with the same reference numerals used to refer to the same configurational components as in the electric circuit 100 and description thereof be omitted.

The soft shutdown resistor Rsco is disposed between the connection point C and the switching element S3 for high speed gate OFF. A resistance value of the soft shutdown resistor Rsco is higher than a resistance value of the resistor Roff for gate OFF.

The current sense resistors Rse1, Rse2 are resistors that are used for the detection of the short circuits of the switching elements IGBT1, IGBT2, respectively. A current in accordance with the collector current of the switching element IGBT1 flows through the current sense resistor Rse1, and a terminal voltage Vse1 in accordance with the current value thereof is output to a short circuit detection circuit 16 included in the driving circuit 302. A current in accordance with the collector current of the switching element IGBT2 flows through the current sense resistor Rse2, and a terminal voltage Vse2 in accordance with the current value thereof is output to the short circuit detection circuit 16.

The driving circuit 302 is configured to include the short circuit detection circuit 16. The short circuit detection circuit 16 detects whether or not the switching elements IGBT1, IGBT2 are in short circuit states. The short circuit detection circuit 16 outputs, to the control circuit 10, a signal showing the switching element in the short circuit state when either one of the switching elements is in the short circuit state. In other words, in a case where the switching element IGBT1 or the switching element IGBT2 is subjected to the short circuit, the terminal voltage Vse1 or the terminal voltage Vse2 increases. Accordingly, the short circuit detection circuit 16 can determine that the switching element IGBT1 or the switching element IGBT2 is in the short circuit state in a case where the terminal voltage Vse1 or the terminal voltage Vse2 is equal to or higher than a short circuit reference voltage. As described above, the current sense resistors Rse1, Rse2 and the short circuit detection circuit 16 function as short circuit detection means for detecting the short circuits of the switching elements IGBT1, IGBT2 by receiving outputs from the current sense resistors Rse1, Rse2.

The control circuit 10 controls the switching elements IGBT1, IGBT2 to be put into the OFF states in accordance with the signal from the short circuit detection circuit 16 when either one of the switching elements IGBT1, IGBT2 is in the short circuit state.

Figure 10:
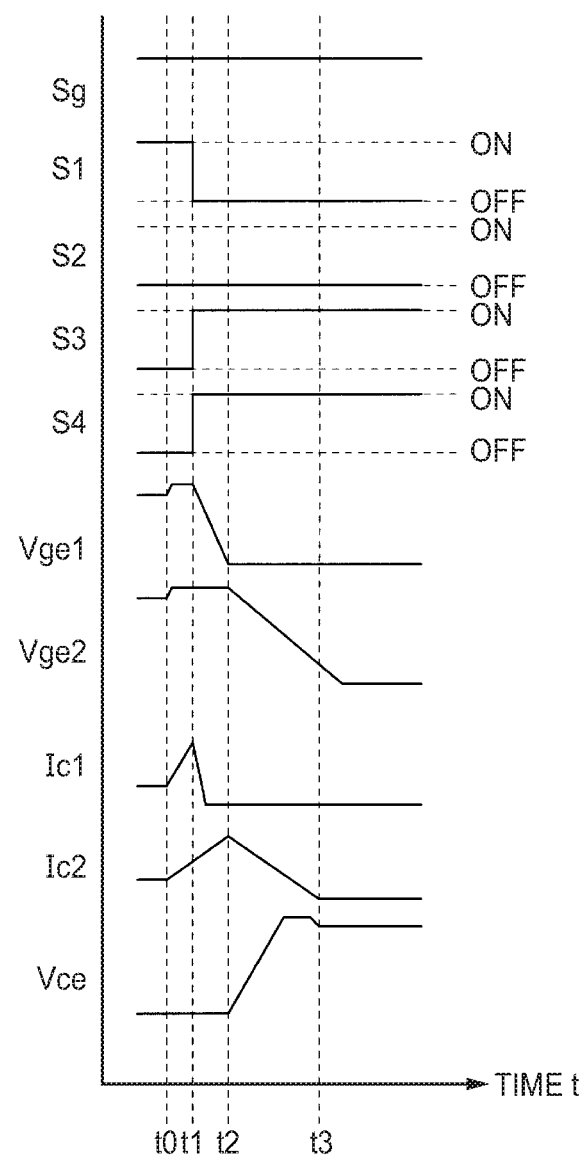
FIG. 10 is a diagram illustrating a timing chart at a time of an OFF control attributable to a short circuit occurrence according to the third embodiment.

Hereinafter, the shutdown control for the electric circuit 300 to put the switching elements IGBT1, IGBT2 into the OFF states from the ON states when either one of the switching elements IGBT1, IGBT2 is in the short circuit state will be described with reference to the timing chart that is illustrated in FIG. 10.

At time t0, either one of the switching elements IGBT1, IGBT2 is in the short circuit state. At time t1, the short circuit detection circuit 16 detects that either one of the switching elements IGBT1, IGBT2 is in the short circuit state and outputs a short circuit signal to the control circuit 10. The control circuit 10 initiates the control for putting the switching elements IGBT1, IGBT2 into the OFF states upon receiving the short circuit signal from the short circuit detection circuit 16. The control circuit 10 maintains the switching element S1 for ON in the OFF state and the switching element S2 for OFF in the OFF state regardless of the control signal Sg. In addition, the control circuit 10 puts the switching element S3 for high speed gate OFF into the ON state and puts the switching element S4 for high speed gate OFF into the ON state at the same time.

Then, the gate terminal of the switching element IGBT1 is grounded via the switching element S4 for high speed gate OFF and the gate terminal of the switching element IGBT2 is grounded via the soft shutdown resistor Rsco and the resistor Rg2 for resonance suppression. Accordingly, the switching element IGBT2 is put into the OFF state more slowly than the switching element IGBT1 and the switching element IGBT1 is put into the OFF state before the switching element IGBT2 is put into the OFF state. The voltage Vge2 of the gate terminal of the switching element IGBT2 becomes equal to or lower than the threshold voltage at time t3, and the collector current Ic2 of the switching element IGBT2 becomes 0. Once the gate voltage becomes equal to or lower than the threshold voltage as described above, no current flows through the switching element and the oscillation of the circuit can be prevented.

As described above, the oscillation can be suppressed by one of the switching elements being put into the OFF state prior to the other one of the switching elements in a case where either one of the switching elements IGBT1, IGBT2 is subjected to the short circuit. In particular, destruction of the switching elements, which might arise when the oscillation occurs in the case of the short circuit in either one of the switching elements IGBT1, IGBT2, can be prevented.

Figure 11:
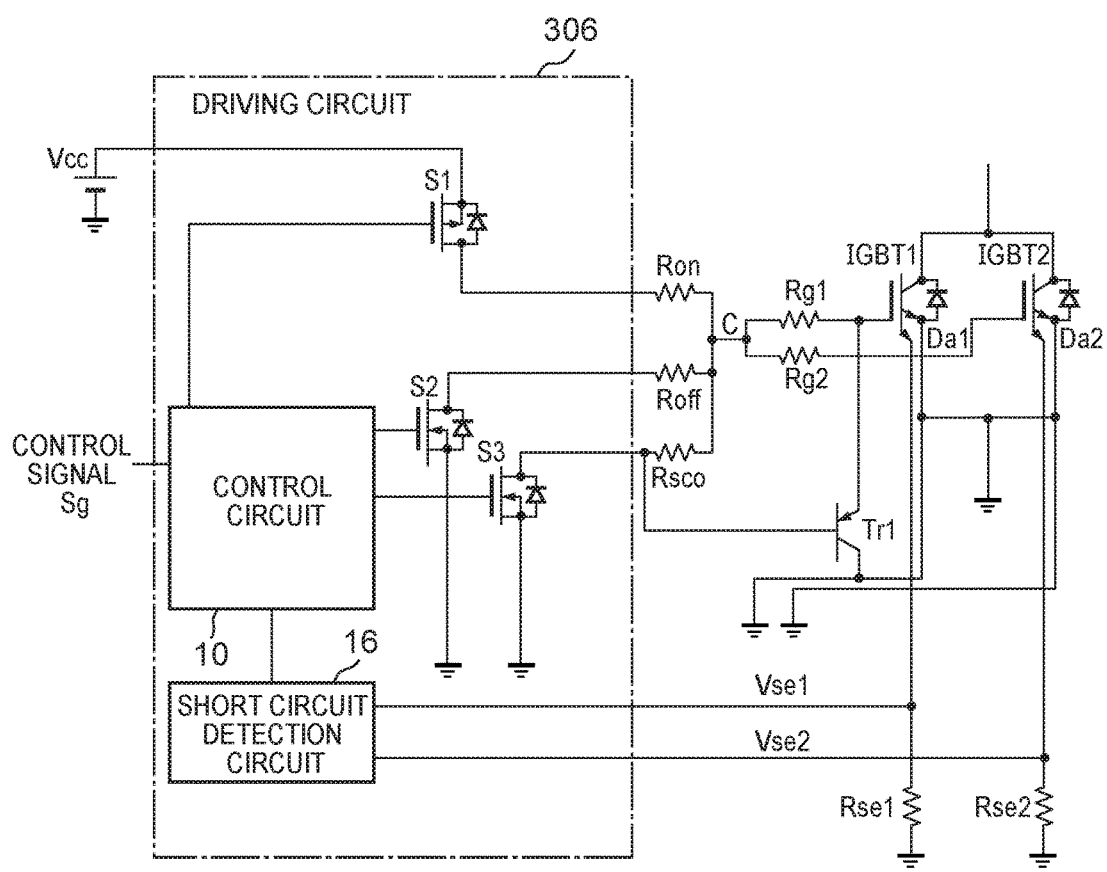
FIG. 11 is a diagram illustrating a configuration of a modification example of the electric circuit according to the third embodiment.

As illustrated in the form of an electric circuit 304 in FIG. 11, the electric circuit according to this embodiment may be configured to have a transistor Tr1 disposed instead of the switching element S4 for high speed gate OFF. The transistor Tr1 may be a PNP-type transistor. In other words, the gate terminal of the switching element IGBT1 is connected to the emitter terminal of the switching element IGBT1 and grounded via a collector and an emitter of the transistor Tr1 without the switching element S4 for high speed gate OFF being disposed in a driving circuit 306. In addition, a base terminal or a gate terminal of the transistor Tr1 is grounded via the switching element S3 for high speed gate OFF.

In a case where either one of the switching elements IGBT1, IGBT2 is in the short circuit state in this configuration, the control circuit 10 puts the switching element S1 for ON into the OFF state, maintains the switching element S2 for OFF in the OFF state, and puts the switching element S3 for high speed gate OFF into the ON state. Then, the transistor Tr1 is put into the ON state and the gate terminal of the switching element IGBT1 is grounded via the collector and the emitter of the transistor Tn. The gate terminal of the switching element IGBT2 is grounded via the soft shutdown resistor Rsco and the resistor Rg2 for resonance suppression. Accordingly, the switching element IGBT2 is put into the OFF state more slowly than the switching element IGBT1 and the switching element IGBT1 is put into the OFF state before the switching element IGBT2 is put into the OFF state.

Figure 12:
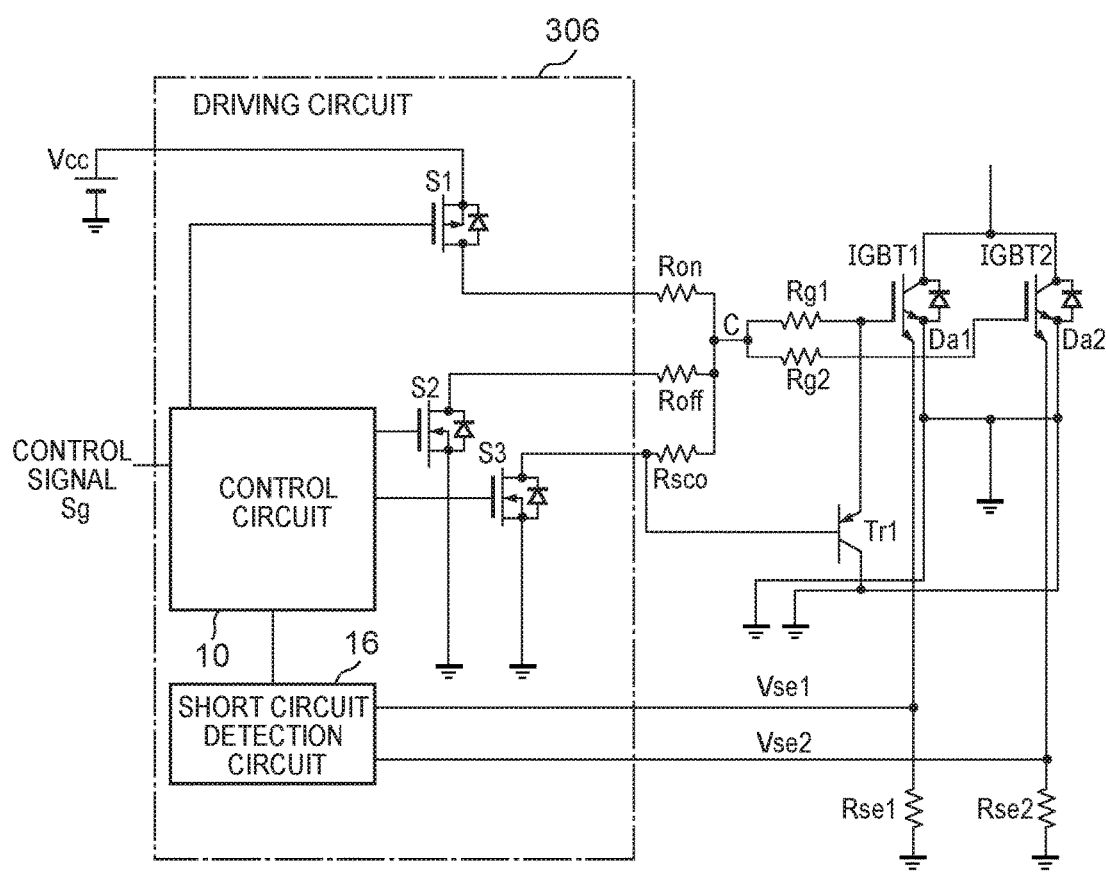
FIG. 12 is a diagram illustrating the configuration of the modification example of the electric circuit according to the third embodiment.

The gate terminal of the switching element IGBT1 may be configured to be connected to the emitter terminal of the switching element IGBT2 and grounded via the collector and the emitter of the transistor Tr1 as illustrated in the form of an electric circuit 308 in FIG. 12. In determining whether to adopt the configuration of the electric circuit 304 or the electric circuit 308, the one with a higher oscillation suppression effect may be appropriately selected in view of the circuit characteristics including electrical characteristics of the switching elements IGBT1, IGBT2.

Figure 13:
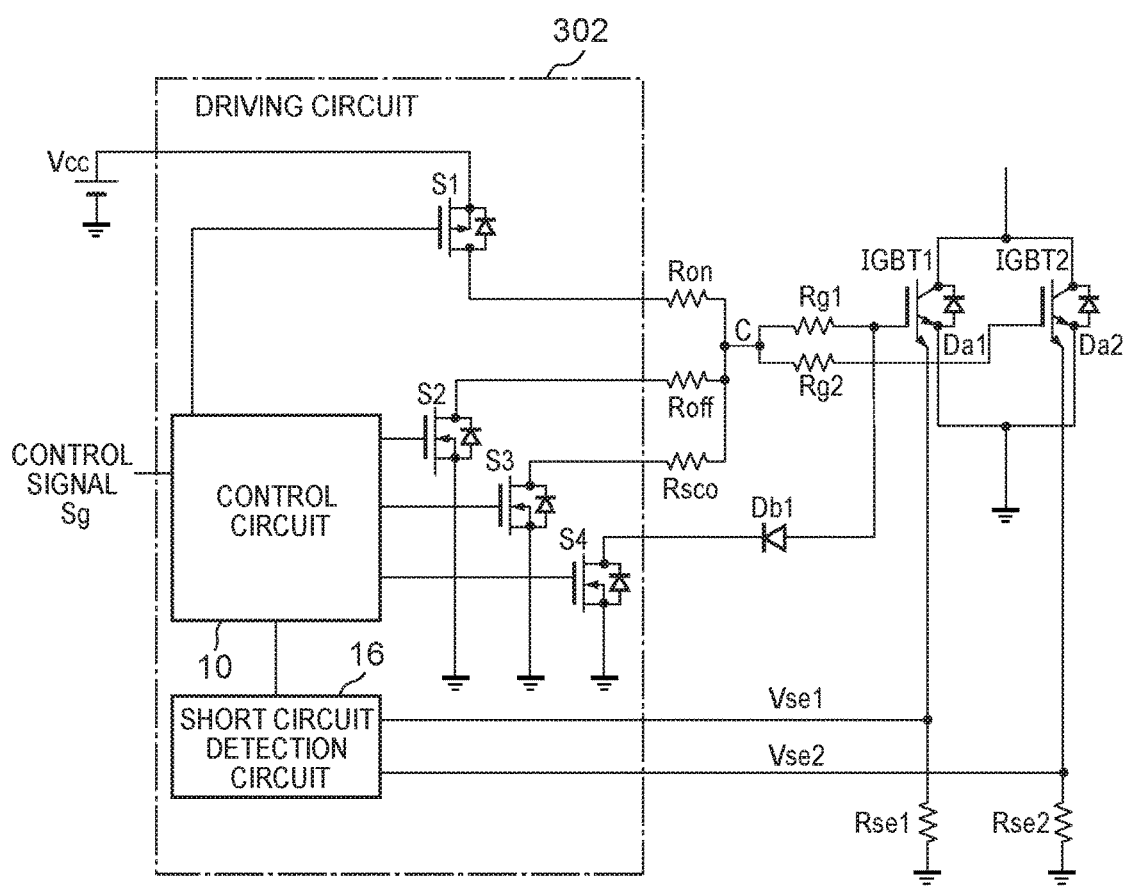
FIG. 13 is a diagram illustrating the configuration of the modification example of the electric circuit according to the third embodiment.

In an alternative configuration, the diode Db1 for resonance suppression may be additionally disposed as illustrated in the form of an electric circuit 310 in FIG. 13. Then, the resonance resulting from the capacitance of the gates of the switching elements IGBT1, IGBT2 and the parasitic inductance in the wiring of the gate terminals can be suppressed when the switching element S3 for high speed gate OFF and the switching element S4 for high speed gate OFF are in the ON states.

Figure 14:
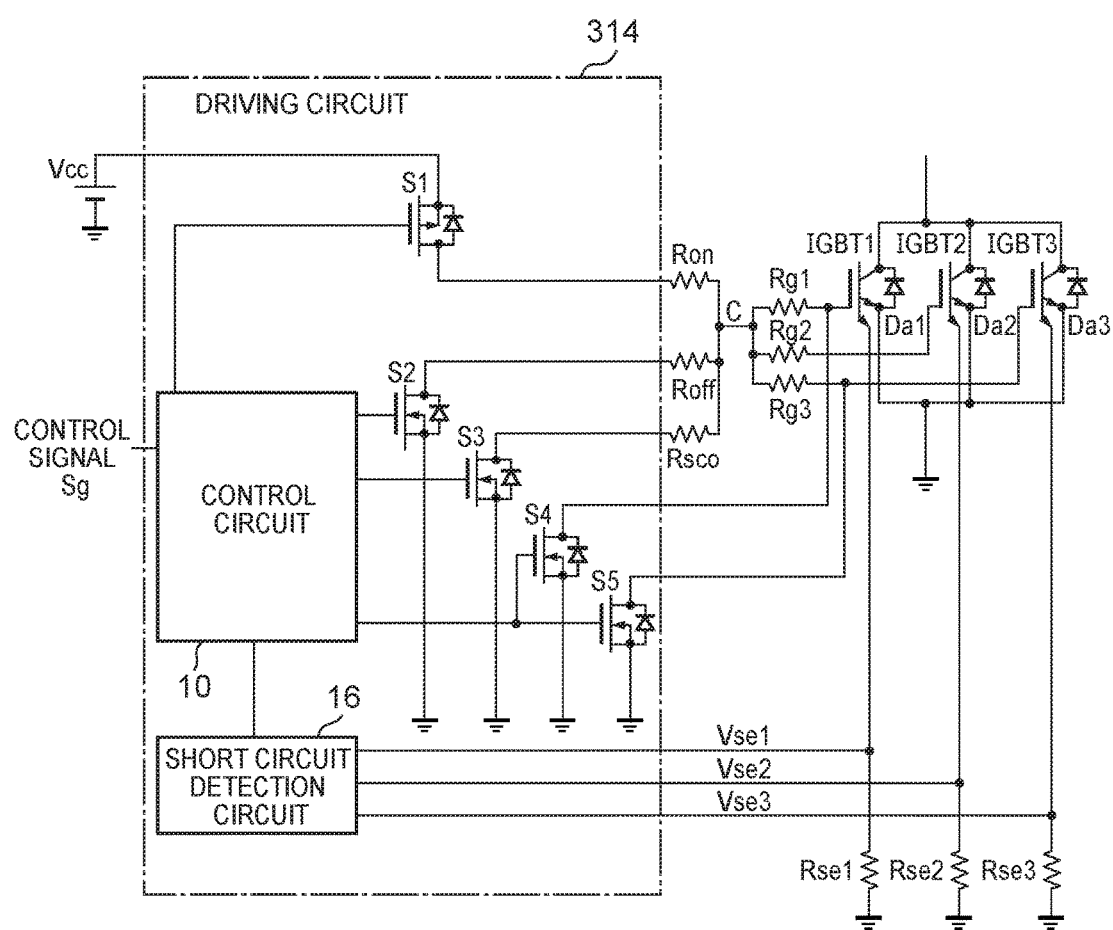
FIG. 14 is a diagram illustrating the configuration of the modification example of the electric circuit according to the third embodiment.

In an alternative configuration, the switching element IGBT3 may also be connected in parallel to the switching elements IGBT1, IGBT2 as illustrated in the form of an electric circuit 312 in FIG. 14. In this case, a current in accordance with the collector current of the switching element IGBT3 flows through a current sense resistor Rse3, and a terminal voltage Vse3 in accordance with the current value thereof is output to the short circuit detection circuit 16 included in a driving circuit 314. Furthermore, the switching element S5 for high speed gate OFF for putting the switching element IGBT2 into the OFF state at a high speed is additionally disposed in the driving circuit 314.

In a case where any one of the switching elements IGBT1, IGBT2, IGBT3 is in the short circuit state, the switching element in the short circuit state is detected by the short circuit detection circuit 16. Upon the short circuit being detected by the short circuit detection circuit 16, the control circuit 10 puts the switching element S1 for ON into the OFF state, maintains the switching element S2 for OFF in the OFF state, and puts the switching elements S3, S4, S5 for high speed gate OFF into the ON states. Then, the gate terminals of the switching elements IGBT1, IGBT2 are grounded via the switching elements S4, S5 for high speed gate OFF and the gate terminal of the switching element IGBT3 is grounded via the soft shutdown resistor Rsco and the resistor Rg3 for resonance suppression. Accordingly, the switching element IGBT3 is put into the OFF state more slowly than the switching elements IGBT1, IGBT2 and the switching elements IGBT1, IGBT2 are put into the OFF states before the switching element IGBT3 is put into the OFF state. Accordingly, the oscillations of the switching elements IGBT1, IGBT2, IGBT3 can be suppressed.

Figure 15:
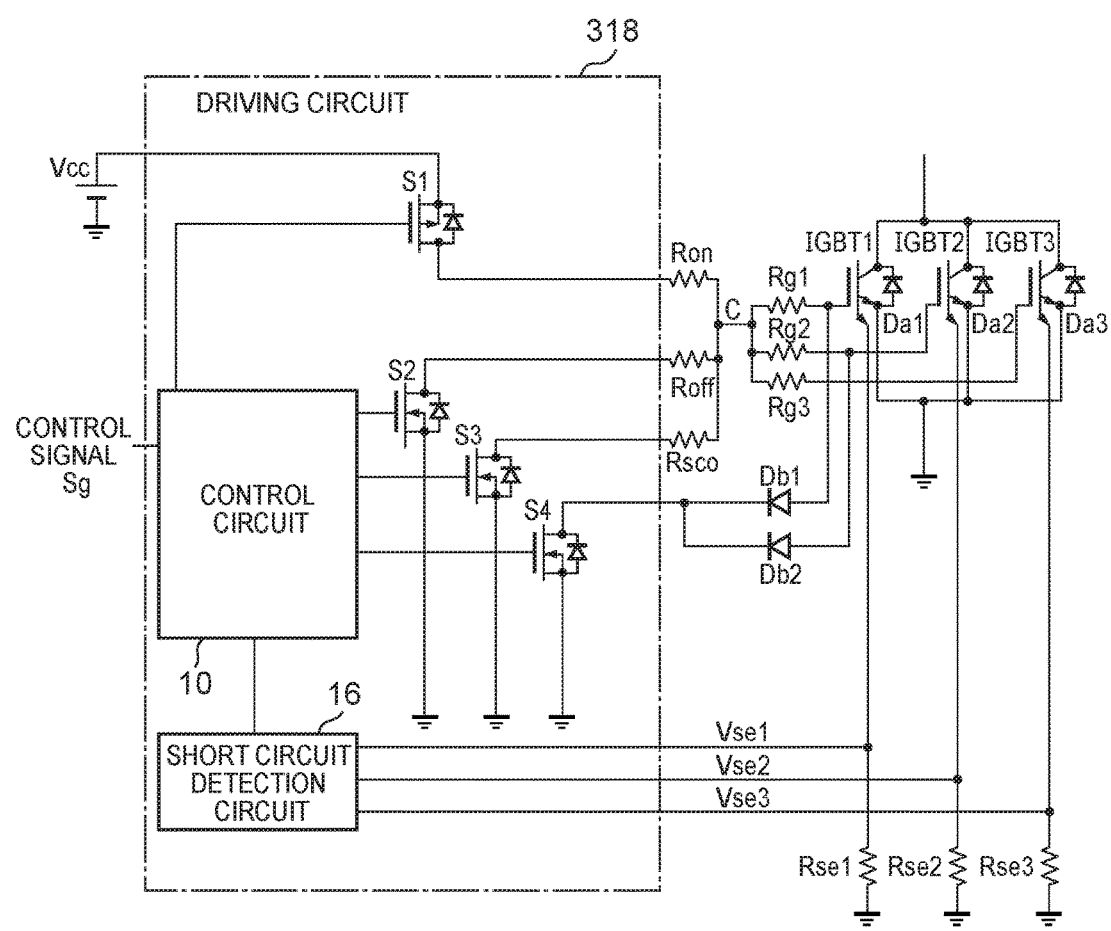
FIG. 15 is a diagram illustrating the configuration of the modification example of the electric circuit according to the third embodiment.

Moreover, the diodes Db1, Db2 may be disposed between the gate terminals of the switching elements IGBT1, IGBT2 and the switching element S4 for high speed gate OFF as illustrated in the form of an electric circuit 316 in FIG. 15, respectively. The resonance resulting from the capacitance of the gates of the switching elements IGBT1, IGBT2 and the parasitic inductance in the wiring of the gate terminals can be suppressed when the switching element S4 for high speed gate OFF is in the ON state. At this time, the switching element S4 for high speed gate OFF with respect to the switching elements IGBT1, IGBT2 can be in common in a driving circuit 318.

Figure 16:
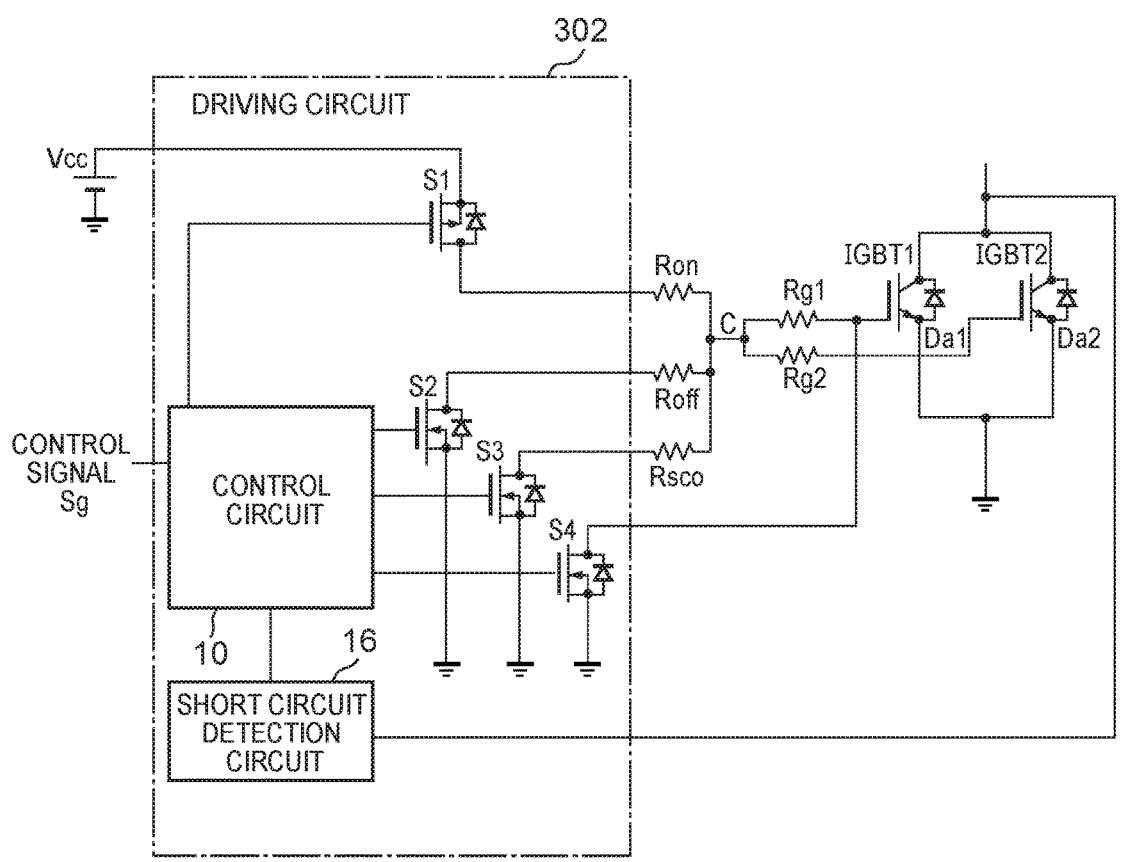
FIG. 16 is a diagram illustrating the configuration of the modification example of the electric circuit according to the third embodiment.

In an alternative configuration, the short circuit may be detected by the collector voltages of the switching elements IGBT1, IGBT2, as illustrated in the form of an electric circuit 320 in FIG. 16, instead of the current sense resistors Rse1, Rse2 being disposed with respect to the respective switching elements IGBT1, IGBT2. In other words, the collector voltages of the switching elements IGBT1, IGBT2 are input to the short circuit detection circuit 16, and the control for putting the switching elements IGBT1, IGBT2 into the OFF states is performed, with the short circuit regarded as occurring, in a case where the collector voltages become equal to or higher than the short circuit reference voltage.

Figure 17:
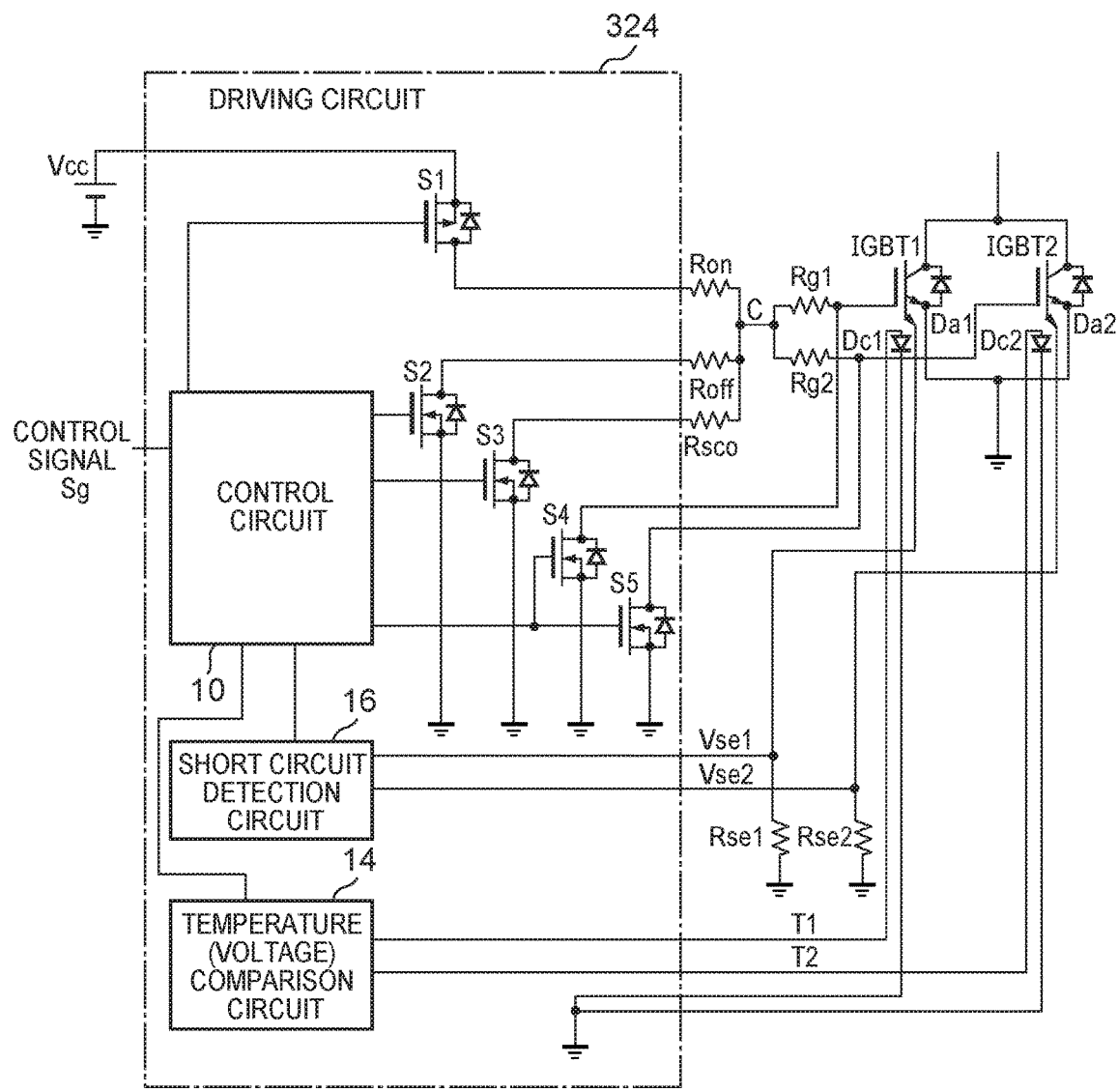
FIG. 17 is a diagram illustrating the configuration of the modification example of the electric circuit according to the third embodiment.

The element with a higher temperature may be controlled to be turned OFF first when either one of the switching elements IGBT1, IGBT2 is subjected to the short circuit, with the temperature comparison circuit 14 and the short circuit detection circuit 16 disposed in a driving circuit 324, as illustrated in the form of an electric circuit 322 in FIG. 17. In other words, in a case where the short circuit is detected by the short circuit detection circuit 16 and it is determined by the temperature comparison circuit 14 that the temperature of the switching element IGBT1 is higher than the temperature of the switching element IGBT2, the control circuit 10 puts the switching element S1 for ON and the switching element S2 for OFF into the OFF states, the switching element S3 for high speed gate OFF into the ON state, the switching element S4 for high speed gate OFF into the ON state, and the switching element S5 for high speed gate OFF into the OFF state. This allows the switching element IGBT1 to be put into the OFF state prior to the switching element IGBT2. After the switching element IGBT1 is turned OFF, the switching element IGBT2 is put into the OFF state. In a case where the short circuit is detected by the short circuit detection circuit 16 and it is determined by the temperature comparison circuit 14 that the temperature of the switching element IGBT2 is higher than the temperature of the switching element IGBT1, the control circuit 10 puts the switching element S1 for ON and the switching element S2 for OFF into the OFF states, the switching element S3 for high speed gate OFF into the ON state, the switching element S4 for high speed gate OFF into the OFF state, and the switching element S5 for high speed gate OFF into the ON state. This allows the switching element IGBT2 to be put into the OFF state prior to the switching element IGBT1. After the switching element IGBT2 is turned OFF, the switching element IGBT1 is put into the OFF state.

It is desirable that the OFF states are slowly reached for a surge current to be suppressed when the switching elements IGBT1, IGBT2 are subjected to the short circuits and the switching elements IGBT1, IGBT2 are put into the OFF states. In a case where the switching element IGBT1 is put into the OFF state first, however, a state where the soft shutdown resistor Rsco and the resistor Rg1 for resonance suppression are connected in parallel arises when viewed from the gate terminal of the other switching element IGBT2, and the surge current at a time when the switching element IGBT2 is turned OFF increases.

Figure 18:
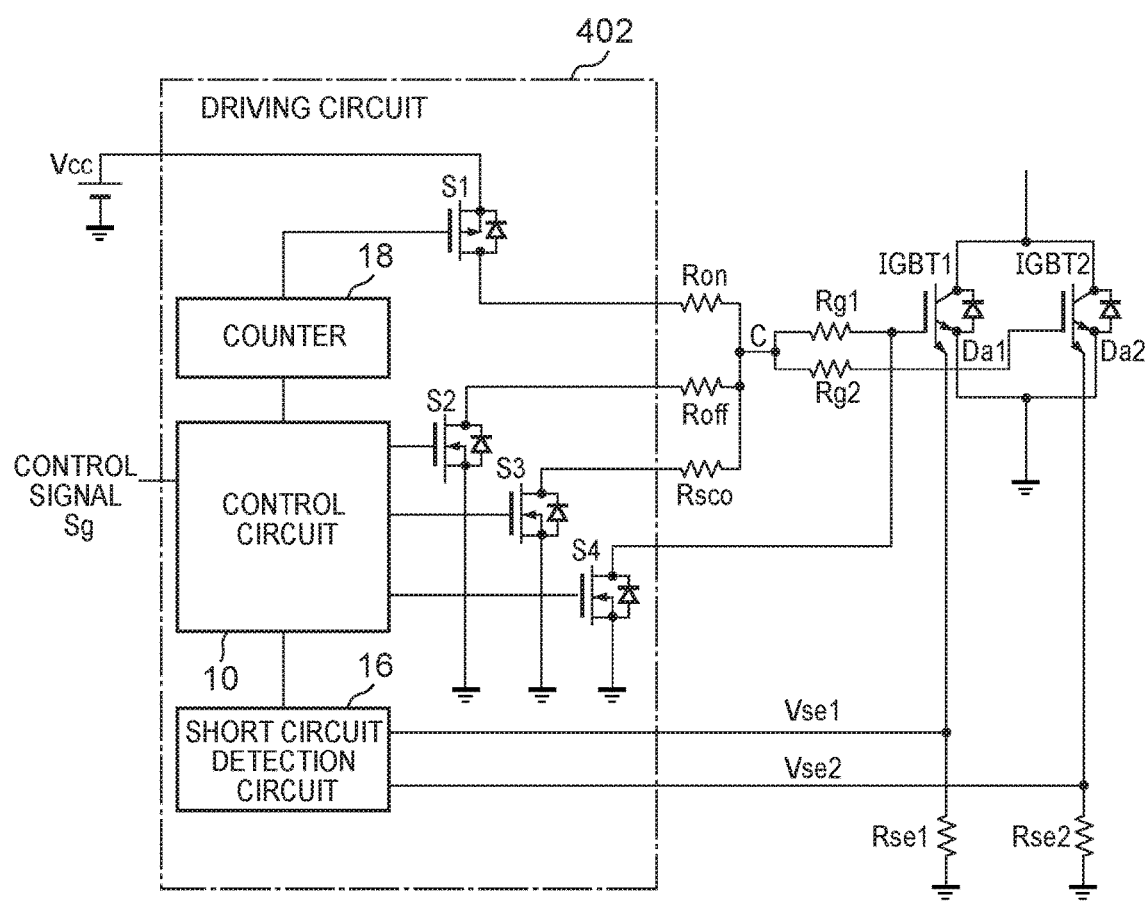
FIG. 18 is a diagram illustrating a configuration of an electric circuit according to a fourth embodiment.

An electric circuit 400 illustrated in FIG. 18 is provided with a driving circuit 402 that includes a counter 18. Upon receiving an ON control count initiation signal from the control circuit 10, the counter 18 maintains the switching element S1 for ON in the ON state for a reference time set in advance from the point in time of the count initiation signal reception. After the elapse of the reference time, the counter 18 puts the switching element S1 for ON into the OFF state. In other words, the counter 18 functions as voltage maintaining means for slowly turning OFF the elements by supplying a current to the gate terminals of the switching elements IGBT1, IGBT2.

Figure 19:
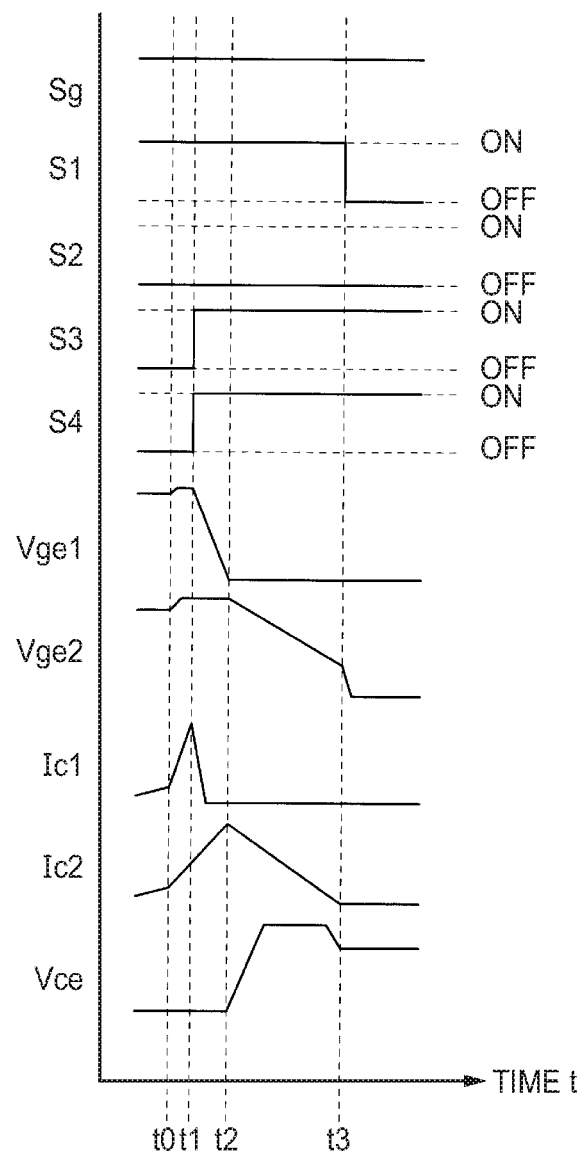
FIG. 19 is a diagram illustrating a timing chart at a time of an OFF control attributable to a short circuit occurrence according to the fourth embodiment.

Hereinafter, the shutdown processing at a time when either one of the switching elements IGBT1, IGBT2 is subjected to the short circuit will be described with reference to the timing chart that is illustrated in FIG. 19.

At time t0, the control circuit 10 initiates the shutdown processing for the switching elements IGBT1, IGBT2 upon receiving, from the short circuit detection circuit 16, the short circuit signal showing that either one of the switching elements IGBT1, IGBT2 is subjected to the short circuit.

At time t1, the control circuit 10 outputs the count initiation signal to the counter 18. The counter 18 maintains the switching element S1 for ON in the ON state for a predetermined period of time set in advance from the point in time of the count initiation signal reception. In addition, the control circuit 10 puts the switching elements S3, S4 for high speed gate OFF into the ON states while maintaining the switching element S2 for OFF in the OFF state.

Then, the gate terminal of the switching element IGBT1 is grounded via the switching element S4 for high speed gate OFF, and the switching element IGBT1 is put into the OFF state prior to the switching element IGBT2 at time t2. The gate terminal of the switching element IGBT2 is grounded via the soft shutdown resistor Rsco and the resistor Rg2 for resonance suppression while the voltage supplied from the electric power source voltage Vcc is applied to the gate terminal of the switching element IGBT2 for a predetermined period of time via the resistor Ron for gate ON and the resistor Rg2 for resonance suppression because of the action of the counter 18. Accordingly, the switching element IGBT2 undergoes a transition to the OFF state more slowly than in a case where the voltage supplied from the electric power source voltage Vcc is not applied.

The counter 18 puts the switching element Si for ON into the OFF state at time t3, when the period of time set in advance has elapsed since the point in time of the count initiation signal reception. Accordingly, the switching element IGBT2 is completely put into the OFF state.

As described above, the surge current toward the switching element can be suppressed and the oscillation can be prevented since the gate voltage is reduced slowly during the OFF control.

In the above-described embodiments and modification examples, the IGBTs have been described as an example of the plurality of switching elements connected in parallel. However, the IGBTs may be replaced with other switching elements such as field effect transistors (FETs) and transistors. In addition, the respective configurations of the above-described embodiments and modification examples may be appropriately combined.

The aspect of the disclosure has the electric circuit that includes the plurality of switching elements which are connected in parallel as its scope of application. For example, it can also be applied to the electric circuits including inverter circuits, converter circuits, and current mirror circuits.

What is claimed is:

1. An electric circuit comprising:
   a plurality of switching elements connected in parallel to each other, the plurality of switching elements including a first switching element and a second switching element;
   a control voltage application element applying a control voltage to a connection point at which respective gates of the plurality of switching elements are connected to each other;
   a connection point grounding element grounding the connection point; and
   a control circuit configured to put the first switching element into an ON state and maintain the second switching element in an OFF state during a stand-by period, and put the second switching element into an ON state after an elapse of the stand-by period.

2. The electric circuit according to claim 1,
   wherein the control circuit is configured to cause the stand-by period to continue until the control voltage of the first switching element exceeds a mirror voltage.

3. The electric circuit according to claim 1, further comprising:
   a first OFF switching element grounding the gate of the first switching element; and
   a second OFF switching element grounding the gate of the second switching element,
   wherein the control circuit is configured to put the first OFF switching element into an OFF state and put the second OFF switching element into an ON state during the stand-by period, and put the second OFF switching element into an OFF state after the elapse of the stand-by period.

4. The electric circuit according to claim 1, further comprising:
   a temperature detection device measuring temperatures of the plurality of switching elements,
   wherein the control circuit is configured to handle the switching element lower in temperature than one of the plurality of switching elements with a highest temperature as the first switching element based on the temperatures of the plurality of switching elements measured by the temperature detection device.

5. The electric circuit according to claim 3, further comprising:
   a diode connected in series to the first OFF switching element and a diode connected in series to the second OFF switching element.

6. An electric circuit comprising:
   a plurality of switching elements connected in parallel to each other, the plurality of switching elements including a first switching element and a second switching element;
   a control voltage application element applying a control voltage to a connection point at which respective gates of the plurality of switching elements are connected to each other;
   a connection point grounding element grounding the connection point; and
   a control circuit configured to put the second switching element into an OFF state and maintain the first switching element in an ON state during a stand-by period, and put the first switching element into an OFF state after the stand-by period.

7. The electric circuit according to claim 6, further comprising:
   a first OFF switching element grounding the gate of the first switching element; and
   a second OFF switching element grounding the gate of the second switching element,
   wherein the control circuit is configured to put the second OFF switching element into an ON state and put the first OFF switching element into an OFF state during the stand-by period, and put the first OFF switching element into an ON state after an elapse of the stand-by period.

8. The electric circuit according to claim 7,
   wherein the control circuit is configured to cause the stand-by period to continue until the control voltage of the first switching element becomes equal to or lower than a threshold voltage.

9. The electric circuit according to claim 7,
   wherein the control circuit is configured to cause the stand-by period to continue until the control voltage of the first switching element becomes lower than a mirror voltage.

10. The electric circuit according to claim 6, further comprising:
    a first resistor;
    a first OFF switching element connected in series to the first resistor and grounding the gate of the first switching element; and
    a second OFF switching element grounding the gate of the second switching element,
    wherein the control circuit puts the first OFF switching element and the second OFF switching element into ON states.

11. The electric circuit according to claim 10,
wherein the gate of the first switching element is connected to an emitter of the second switching element.

12. The electric circuit according to claim 10,
wherein the gate of first switching element is connected to an emitter of another switching element.

13. The electric circuit according to claim 6, further comprising:
a temperature detection device measuring temperatures of the plurality of switching elements,
wherein the control circuit is configured to regard the switching element lower in temperature than one of the plurality of switching elements with a highest temperature as the first switching element based on the temperatures of the plurality of switching elements measured by the temperature detection device.

14. The electric circuit according to claim 6,
wherein the control circuit is configured to detect short circuit states of the plurality of switching elements, and turn OFF the plurality of switching elements in a case where a short circuit of any one of the plurality of switching elements is detected.

15. The electric circuit according to claim 14,
wherein the control circuit is configured to maintain the control voltage application element applying the control voltage to the connection point in an ON state for a predetermined period of time.

16. The electric circuit according to claim 7, further comprising:
a diode connected in series to the first OFF switching element and a diode connected in series to the second OFF switching element.

\* \* \* \* \*